United States Patent
Seshadri

(10) Patent No.: US 8,325,511 B2
(45) Date of Patent: Dec. 4, 2012

(54) RETAIN-TILL-ACCESSED POWER SAVING MODE IN HIGH-PERFORMANCE STATIC MEMORIES

(75) Inventor: Anand Seshadri, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 270 days.

(21) Appl. No.: 12/764,426

(22) Filed: Apr. 21, 2010

(65) Prior Publication Data

US 2011/0261609 A1    Oct. 27, 2011

(51) Int. Cl.
  *G11C 11/00* (2006.01)
  *G11C 7/00* (2006.01)
  *G11C 5/14* (2006.01)
(52) U.S. Cl. .............. 365/154; 365/227; 365/189.11
(58) Field of Classification Search .......... 365/154, 365/155, 156, 227, 189.11
See application file for complete search history.

(56) References Cited

U.S. PATENT DOCUMENTS

| | | | |
|---|---|---|---|
| 7,376,038 | B2 | 5/2008 | Thiruvengadam et al. |
| 7,385,841 | B2 | 6/2008 | Houston |
| 7,453,743 | B2 | 11/2008 | Houston |
| 7,596,012 | B1 | 9/2009 | Su et al. |
| 2006/0002223 | A1 | 1/2006 | Song et al. |
| 2007/0279966 | A1 | 12/2007 | Houston |
| 2009/0258471 | A1 | 10/2009 | Sadra et al. |

FOREIGN PATENT DOCUMENTS

| | | |
|---|---|---|
| JP | 2008090958 A | 4/2008 |
| JP | 2009076169 A | 4/2009 |
| KR | 100662215 B1 | 12/2006 |

OTHER PUBLICATIONS

Yamaoka et al., "Low-Power Embedded SRAM Modules with Expanded Margins for Writing", Paper No. 26.4, Tech. Digest of Int'l Solid-State Circuits Conference (IEEE, 2005), pp. 480-481, 611.

*Primary Examiner* — Ly D Pham
(74) *Attorney, Agent, or Firm* — Rose Alyssa Keagy; Wade J. Brady, III; Frederick J. Telecky, Jr.

(57) ABSTRACT

Bias circuitry for a static random-access memory (SRAM) with a retain-till-accessed (RTA) mode. The memory is constructed of multiple memory array blocks, each including SRAM cells of the 8-T or 10-T type, with separate read and write data paths. Bias devices are included within each memory array block, for example associated with individual columns, and connected between a reference voltage node for cross-coupled inverters in each memory cell in the associated column or columns, and a ground node. In a normal operating mode, a switch transistor connected in parallel with the bias devices is turned on, so that the ground voltage biases the cross-coupled inverters in each cell. In the RTA mode, the switch transistors are turned off, allowing the bias devices to raise the reference bias to the cross-coupled inverters, reducing power consumed by the cells in that mode.

31 Claims, 10 Drawing Sheets

RETAIN-TILL-ACCESSED POWER SAVING MODE IN HIGH-PERFORMANCE STATIC MEMORIES

CROSS-REFERENCE TO RELATED APPLICATIONS

This application is related to commonly assigned U.S. patent application Ser. No. 12/764,369 entitled "Reduced Power Consumption in Retain-Till-Accessed Static Memories", and Ser. No. 12/764,399 entitled "Combined Write Assist and Retain-Till-Accessed Memory Array Bias", both filed contemporaneously herewith and incorporated herein by reference.

STATEMENT REGARDING FEDERALLY SPONSORED RESEARCH OR DEVELOPMENT

Not applicable.

BACKGROUND OF THE INVENTION

This invention is in the field of integrated circuits. Embodiments of this invention are more specifically directed to solid-state static random access memories (SRAMs), and power reduction in those SRAMs.

Many modern electronic devices and systems now include substantial computational capability for controlling and managing a wide range of functions and useful applications. Many of these electronic devices and systems are now hand-held portable devices. For example, many mobile devices with significant computational capability are now available in the market, including modern mobile telephone handsets such as those commonly referred to as "smartphones", personal digital assistants (PDAs), mobile Internet devices, tablet-based personal computers, handheld scanners and data collectors, personal navigation devices, and the like. Of course, these systems and devices are battery powered in order to be mobile or handheld. The power consumption of the electronic circuitry in those devices and systems is therefore of great concern, as battery life is often a significant factor in the buying decision as well as in the utility of the device or system.

The computational power of these modern devices and systems is typically provided by one or more processor "cores", which operate as a digital computer in carrying out its functions. As such, these processor cores generally retrieve executable instructions from memory, perform arithmetic and logical operations on digital data that are also retrieved from memory, and store the results of those operations in memory; other input and output functions for acquiring and outputting the data processed by the processor cores are of course also provided. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM memory cells store contents "statically", in that the stored data state remains latched in each cell so long as power is applied to the memory; this is in contrast to "dynamic" RAM ("DRAM"), in which the data are stored as charge on solid-state capacitors, and must be periodically refreshed in order to be retained. However, SRAM cells draw DC current in order to retain their stored state. Especially as the memory sizes (in number of cells) become large, this DC current can become a substantial factor in battery-powered systems such as mobile telephones and the like.

Advances in semiconductor technology in recent years have enabled shrinking of minimum device feature sizes (e.g., MOS transistor gates) into the sub-micron range. This miniaturization is especially beneficial when applied to memory arrays, because of the large proportion of the overall chip area often devoted to on-chip memories. However, this physical scaling of device sizes does not necessarily correlate to similar scaling of device electrical characteristics. In the context of SRAM cells, the memory cell transistors at currently-available minimum feature sizes conduct substantial DC current due to sub-threshold leakage and other short channel effects. As such, the sub-micron devices now used to realize SRAM arrays have increased the DC data retention current drawn by those arrays.

Designers have recently adopted circuit-based approaches for reducing power consumed by integrated circuits including large memory arrays. One common approach is to reduce the power supply voltage applied to memory arrays, relative to the power supply voltage applied to logic circuitry and circuitry peripheral to the memory array (e.g., decoders, sense amplifiers, etc.). This approach not only reduces the power consumed by the memory array, but also helps to reduce sub-threshold leakage in the individual cells.

Another circuit-based approach to reducing power consumption involves placing the memory functions within the integrated circuit into a "retention" state when possible. In conventional memories, the power supply voltages applied to the memory array in the retention state are reduced to voltages below that necessary for access, but above the minimum required for data states to be retained in the memory cells (i.e., above the data-state retention voltage, or "DRV"); memory peripheral circuits are also powered down in this retention mode, saving additional power. Typically, both the "$V_{dd}$" power supply voltage applied to the loads of SRAM cells (e.g., the source nodes of the p-channel transistors in CMOS SRAM cells) and also well bias voltages are reduced in the retention mode. However, significant recovery time is typically involved in biasing the memory array to an operational state from the retention state.

Recently, an intermediate power-down mode has been implemented in integrated circuits with memory arrays of significant size. This intermediate mode is referred to in the art as "retain-till-accessed", or "RTA", and is most often used in those situations in which the memory arrays are split into multiple blocks. In the RTA mode, the peripheral memory circuitry remains fully powered and operational. However, only those block or blocks of the memory array that are being accessed are fully powered; other blocks of the memory that are not being accessed are biased to a reduced array power supply voltage (i.e., above the retention voltage) to reduce power consumption while idle. Well and junction biases (i.e., other than the bias of p-channel MOS source nodes that receive the reduced RTA bias) are typically maintained at the same voltages in RTA mode as in read/write operation, to reduce the recovery time from RTA mode. The power saving provided by the RTA mode can be substantial, especially if some of the larger memory blocks are accessed infrequently. Because of its ability to be applied to individual blocks within a larger-scale integrated circuit, as well as its fast recovery time, the RTA standby mode is now often used with embedded memories in modern mobile Internet devices and smartphones, considering that these devices remain powered-on but not fully active for much of their useful life.

From a circuit standpoint, integrated circuit memories having an RTA mode must include circuitry that establishes the reduced RTA array bias voltage, and that switchably controls entry into and exit from RTA mode during operation. FIG. 1a is a block diagram of a conventional integrated circuit 2 in which such RTA standby is provided. Integrated circuit 2 includes memory array 5, arranged into multiple memory array blocks $6_0$ through $6_3$ of different sizes relative to one another. Each memory array block 6 is associated with corresponding decode and read/write circuitry 11 that addresses, writes data to, and reads data from its associated memory array block 6. Integrated circuit 2 also includes functional and power management circuitry 4, which includes the logic functionality provided by integrated circuit 2, and also circuitry for regulating and distributing power supply voltages throughout integrated circuit 2. For purposes of this example of memory array 5, functional and power management circuitry 4 produces a voltage on power supply line $V_{dd}HDR$ that is sufficient for memory read and write operations. Functional and power management circuitry 4 also produces a "periphery" power supply voltage on power supply line $V_{dd}P$, which is applied to decoder and read/write circuitry 11 and is typically at a different voltage from that of the power supply voltage on line $V_{dd}HDR$ applied to memory array 5 during reads and writes, as known in the art. The actual array power supply voltage applied to each memory array block $6_0$ through $6_3$ is presented on power supply lines $V_{dd}AR_0$ through $V_{dd}AR_3$, respectively. The voltages on lines $V_{dd}AR_0$ through $V_{dd}AR_3$ are defined by way of bias/switch circuits $7_0$ through $7_3$, respectively, and based on the voltage at power supply line $V_{dd}HDR$, as will be described below.

Each memory array block 6 in this conventional integrated circuit 2 is constructed as an array of SRAM cells arranged in rows and columns. As shown in FIG. 1b by the example of six-transistor (6-T) memory cell $12_{j,k}$, which is in the $j^{th}$ row and $k^{th}$ column of one of memory array blocks 6, each SRAM memory cell 12 is biased between the voltage on power supply line $V_{dd}AR$ and a reference voltage (e.g., at ground reference $V_{ss}$). SRAM memory cell $12_{j,k}$ in this case is constructed in the conventional manner as a pair of cross-coupled CMOS inverters, one inverter of series-connected p-channel transistor 13p and n-channel transistor 13n, and the other inverter of series-connected p-channel transistor 14p and n-channel transistor 14n; the gates of the transistors in each inverter are connected together and to the common drain node of the transistors in the other inverter, in the usual manner. N-channel pass transistors 15a, 15b have their source/drain paths connected between one of the cross-coupled nodes and a corresponding one of complementary bit lines $BL_k$, $BL^*_k$, respectively; the gates of pass transistors 15a, 15b are driven by word line $WL_j$ for the row. Accordingly, as known in the art, DC current drawn by SRAM cell $12_{j,k}$ amounts to the sum of the off-state source/drain leakage currents through one of p-channel transistors 13p, 14p and one of n-channel transistors 13n, 14n, plus any gate oxide leakage and junction leakage that may be present. As mentioned above, if transistors 13, 14 are extremely small sub-micron devices, these leakage currents can be significant (as much as 1 nA per memory cell), and can thus result in significant overall standby power consumption if the number of memory cells 12 in memory array blocks 6 is large.

Referring back to FIG. 1a, memory array blocks $6_0$ through $6_3$ may be independently biased into RTA mode in this conventional integrated circuit 2, by operation of bias/switch circuits $7_0$ through $7_3$, respectively. The construction of bias/switch circuit $7_1$ is illustrated in FIG. 1a by way of example. P-channel transistor 8 is connected in diode fashion, with its source at power supply line $V_{dd}HDR$ and its drain and gate connected to node $V_{dd}AR_1$; the voltage drop across transistor 8 from the voltage at line $V_{dd}HDR$ thus establishes voltage on power supply line $V_{dd}AR_1$. Shorting transistor 9 is a relatively large p-channel power transistor with its source/drain path connected between power supply line $V_{dd}HDR$ and power supply line $V_{dd}AR_1$, and its gate receiving control signal $RTA^*_1$ from functional and power management circuitry 4. If memory array block $6_1$ is being accessed for a read or write operation, control signal $RTA^*_1$ is driven to a low logic level, which turns on transistor 9 in bias/switch circuit $7_1$ and shorts out diode 8, setting the voltage at line $V_{dd}AR_1$ at that of power supply line $V_{dd}HDR$. Conversely, if memory array block $6_1$ is to be placed in RTA mode, functional and power management circuitry 4 will drive control signal $RTA^*_1$ to a high logic level. This turns off transistor 9 in bias/switch circuit $7_1$, such that the voltage drop across diode 8 establishes the voltage at node $V_{dd}AR_1$ at a lower voltage (by one diode drop) than the voltage at power supply line $V_{dd}HDR$. In this RTA mode, therefore, the power consumed by memory array block $6_1$ will be reduced by an amount corresponding to at least the square of this voltage reduction. Meanwhile in this RTA mode, periphery power supply line $V_{dd}P$ applied to peripheral memory circuitry, such as decoder and read/write circuitry 11 for each memory array block 6, carries its normal operating voltage, so that this peripheral circuitry is ready to perform an access of its associated memory array block.

It has been observed, in connection with this invention, that it is difficult to optimize the power savings in RTA mode for memory arrays constructed in the conventional fashion. As known in the art, stored data in the SRAM may be lost if the array voltage falls below a minimum data retention bias voltage; conversely, power savings is optimized by biasing the array blocks in RTA mode at a voltage close to that minimum data retention voltage. However, it is difficult to achieve this optimization because of variations in voltage, temperature, and manufacturing parameters; selection of the size and construction of diodes 8 in the example of FIG. 1a to maximize power savings is thus a difficult proposition. In addition, it is now common practice to use different size transistors in the memory cells 12 of memory array blocks 6 of different size; these differences in device sizes create additional difficulty in establishing an optimal RTA array block bias.

It has also been observed, in connection with this invention, that RTA bias optimization is made more difficult by the manner in which conventional integrated circuits with embedded memory arrays are constructed. This conventional construction is shown by way of integrated circuit 2 of FIG. 1a, in which diodes 8 in bias/switch circuits 7 are constructed as part of "core" region 3 including functional and power management circuitry 4. In this core region 3, transistors are constructed substantially differently than the transistors in memory array 5, for example constructed with different channel lengths, different source/drain impurity concentrations via different ion implantation parameters, different gate oxide thicknesses, and the like, relative transistors in SRAM cells 12. For example, according to a conventional 28 nm CMOS manufacturing technology, memory array transistors receive such additional processing as a fluorine implant to increase the effective gate oxide thickness and reduce gate leakage, which the core transistors do not receive; other differences between core and array transistors include different "pocket" implants to implement different threshold voltages for the core and array transistors, and the use of strain engineering techniques to construct the core transistors (e.g., selectively depositing a tensile silicon nitride film over core NMOS transistors and a compressive silicon nitride film over core PMOS transistors) but not to construct the array devices. As described in U.S. patent application Publication US 2009/0258471 A1, published Oct. 15, 2009 and entitled "Application of Different Isolation Schemes for Logic and Embedded Memory", commonly assigned with this application and incorporated herein by reference, the isolation structures and isolation doping profiles used in logic core regions of the integrated circuit may differ from those used in the memory arrays, so that tighter isolation spacing can be attained in the memory array. In summary, conventional integrated circuits often include logic core ("core") devices that are constructed to optimize switching performance, while the array devices are constructed for low leakage and low mismatch variation. These differences in construction between transistors in core region 3 and transistors 13, 14 in memory array 5 reduce the ability of diodes 8 to match transistors 13, 14 over variations in process parameters. Additional margin must therefore be provided in selecting the construction of diodes 8 and the resulting voltage drop, to ensure that the minimum data retention voltage is satisfied, but this additional margin necessarily leads to additional standby power consumption.

As mentioned above, it is known in the art to use different size transistors to realize memory cells 12 in memory array blocks 6 of different size. Typically, memory array blocks 6 are grouped according to the number of bits (i.e., number of columns, if a common number of rows per block is enforced), with common transistor sizes based on the group. For example, thirty-two row memory array blocks 6 may be grouped into "bins" of increasing transistor size (W/L): from 16 to 128 columns; from 129 to 256 columns; from 257 to 320 columns, and from 321 to 512 columns. By way of further background, it is also known in the art to provide different size core device diodes 8 for memory array blocks 6 realized by transistors of different sizes. For example, the W/L of p-channel MOS diodes 8 may range from 1.0/0.75 (μm) for memory array blocks 6 of 16 to 128 columns, 1.5/0.065 for memory array blocks 6 of 129 to 256 columns, 2.5/0.055 for memory array blocks 6 of 257 to 320 columns, and 5.0/0.045 for memory array blocks 6 of 321 to 512 columns in size. Even according to this approach, however, it has been observed, in connection with this invention, that a large margin must still be provided for the RTA voltage, because of the wide variation in leakage with variations in power supply voltage, temperature, and process variations, as well as the variation in leakage current drawn with the number of columns in memory array blocks 6 even within a given bin. As such, while this "binning" reduces somewhat the leakage current drawn in the RTA mode, the RTA bias voltage must still be maintained well above the data retention voltage (DRV), and is thus not optimized.

Even though conventional RTA mode circuitry has greatly reduced the recovery time from RTA mode to normal operation, as compared with the recovery time from a retention or a full power-down mode, the recovery time from RTA mode remains sufficiently long as to be unacceptable in certain high performance applications. As such, many very large scale integrated circuits, such as the well-known "system on a chip" (or "SoC") integrated circuits, include both high density SRAM memory, in which RTA mode and other power savings techniques are realized, and also high performance SRAM memory. Logic functionality in the integrated circuit determines which type of data to store in these different types of SRAM memory.

The lack of RTA mode in high performance SRAM memory comes at a substantial power dissipation penalty, even if the high performance SRAM capacity is minimized. For example, in one conventional SoC implementation constructed with submicron feature size technology, the memory density realized in high performance SRAM is about ⅓ that realized in high density SRAM. However, it has been observed that the high performance SRAM consumes as much power, in its data retention mode without RTA bias, as that consumed by all of the high density memory in its RTA mode.

By way of further background, some conventional high performance SRAM memories are now realized by way of eight transistor ("8-T") memory cells, constructed by way of a 6-T latch as shown in FIG. 1b, in combination with a two-transistor read buffer. An example of this 8-T construction is illustrated in FIG. 1c in connection with SRAM cell 12'$_{j,k}$ (in row j and column k, as before). Cell 12'$_{j,k}$ includes the 6-T latch of transistors 13p, 13n, 14p, 14n, 15a, 15b, as described above relative to FIG. 1b. However, in cell 12'$_{j,k}$, write word line WR_WL$_j$ connected to the gates of pass transistors 15a, 15b is asserted only for the j$^{th}$ row in write cycles, to connect storage nodes S1, S2 to complementary write bit lines WR_BL$_k$, WR_BL*$_k$ for the k$^{th}$ column. In a write to cell 12'$_{j,k}$, write circuitry (not shown) pulls one of write bit lines WR_BL$_k$, WR_BL*$_k$ to ground, depending on the data state being written into cell 12'$_{j,k}$. Cell 12'$_{j,k}$ also includes n-channel transistors 16n, 18n, which have their source-drain paths connected in series between read bit line RD_BL$_k$ and ground. Read buffer pass transistor 18n has its drain connected to read bit line RD_BL$_k$, and its gate receiving read word line RD_WL$_j$ for row j. Read buffer driver transistor 16n has its drain connected to the source of transistor 18n and its source at ground; the gate of transistor 16n is connected to storage node S2. In a read of cell 12'$_{j,k}$, read word line RD_WL$_j$ is asserted active high, which turns on buffer pass transistor 18n if the data state of storage node S2 is a "1"; in this case, read bit line RD_BL$_k$ is pulled to ground by buffer driver transistor 16n through buffer pass transistor 18n. A read of cell 12'$_{j,k}$ in the case in which storage node S2 is a "0" results in transistor 16n remaining off, in which case read bit line RD_BL$_k$ is not pulled down. A sense amplifier (not shown) is capable of detecting whether read bit line RD_BL$_k$ is pulled to ground by the selected cell in column k, and in turn communicates that data state to I/O circuitry as appropriate.

By way of still further background, the 8-T concept described in connection with FIG. 1c is further extended, in some conventional SRAM memories, to provide complementary read bit lines. An example of this extended structure is illustrated by way of cell 12"$_{j,k}$ shown in FIG. 1d. Cell 12"$_{j,k}$ includes the eight transistors of cell 12'$_{j,k}$ shown in FIG. 1c, but also includes transistors 16n', 18n' that forward the data state at storage node S1 to complementary read bit line RD_BL*$_k$, in similar fashion as transistors 16n, 18n forward the state at storage node S2 to read bitline RD_BL$_k$. In a read cycle, enabled by read word line RD_WL$_j$ driven active high, which turns on transistors 18n, 18n', a differential signal is generated on read bit lines RD_BL$_k$, RD_BL*$_k$ according to the states at storage nodes S2, S1. SRAM cells constructed as shown in FIG. 1d are referred to in the art as "10-T" cells.

BRIEF SUMMARY OF THE INVENTION

Embodiments of this invention provide a high performance static random access memory (SRAM) in which a reduced array bias is provided in a retain-till-accessed (RTA) in a manner that minimizes power consumption due to cell leakage in the RTA mode.

Embodiments of this invention provide such an SRAM in which the RTA mode array bias is useful in SRAM memories with separate read and write bit lines and word lines, such as those SRAMs realized by 8-T or 10-T CMOS SRAM cells.

Embodiments of this invention provide such an SRAM that minimizes the chip area penalty for the devices establishing the RTA mode array bias.

Other objects and advantages provided by embodiments of this invention will be apparent to those of ordinary skill in the art having reference to the following specification together with its drawings.

Embodiments of this invention can be realized by constructing a static random access memory (SRAM) array constructed of 8-T or 10-T memory cells, for which separate read and write bit lines are provided. A bias device is included in series between a ground reference potential and the driver transistors in each memory cell of a given column or columns. The bias device reduces the power supply voltage across the memory cells in a reduced power mode, such as retain-till-accessed (RTA) mode.

BRIEF DESCRIPTION OF THE SEVERAL VIEWS OF THE DRAWING

FIG. 1b is an electrical diagram, in schematic form, of a memory cell in the conventional integrated circuit of FIG. 1a.

DETAILED DESCRIPTION OF THE INVENTION

The present invention will be described in connection with its preferred embodiment, namely as implemented into an integrated circuit including an embedded memory array, and constructed according to complementary metal-oxide-semiconductor (CMOS) technology. However, it is contemplated that the benefits of this invention may be attained when realized in other applications and constructed according to other technologies. Accordingly, it is to be understood that the following description is provided by way of example only, and is not intended to limit the true scope of this invention as claimed.

Figure 2:
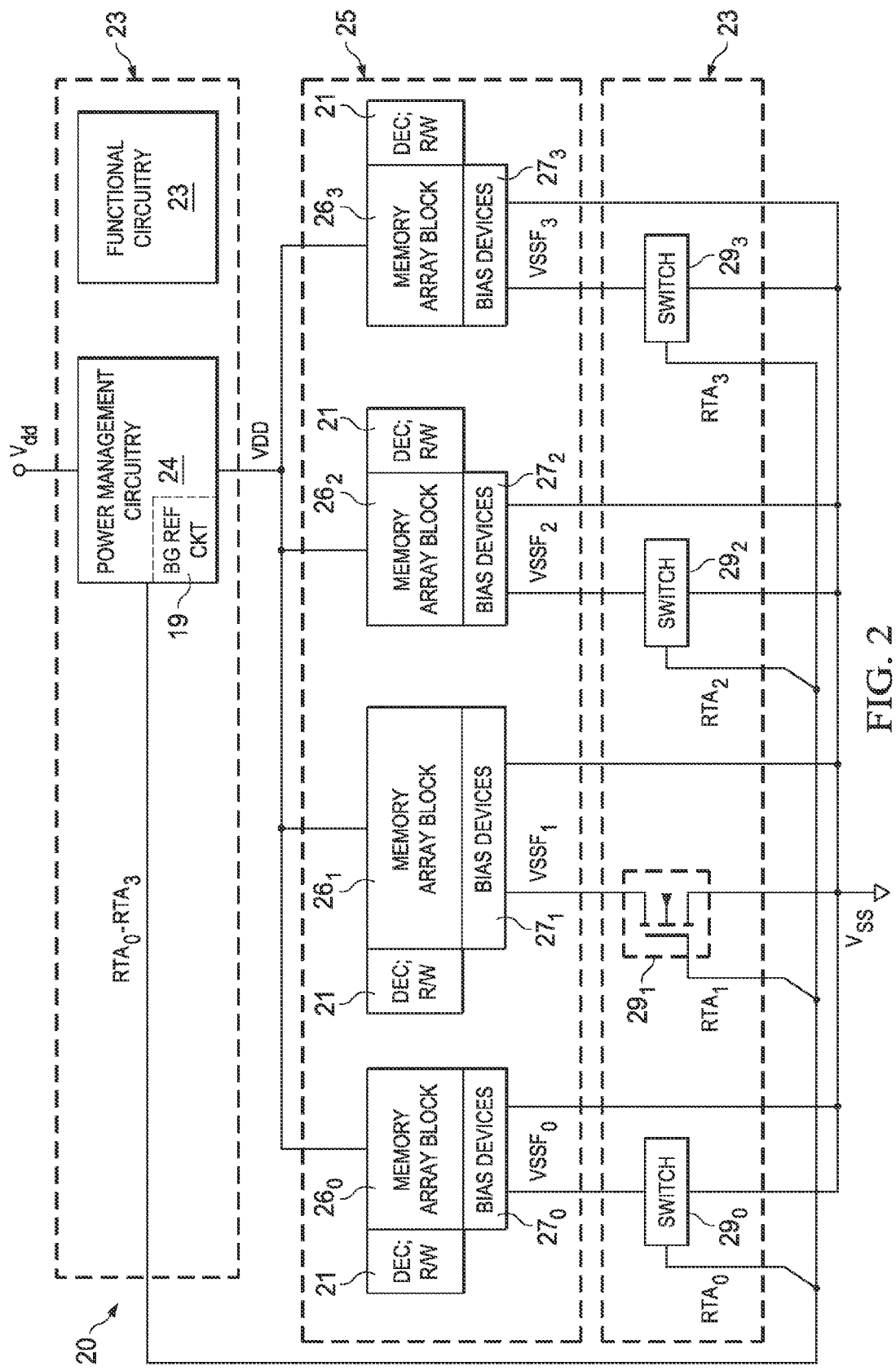
FIG. 2 is an electrical diagram, in block form, of an integrated circuit including a memory array constructed according to embodiments of this invention.

Referring now to FIG. 2, by way of example, integrated circuit 20 constructed according to embodiments of this invention will now be described at a block diagram level. As shown in FIG. 2, integrated circuit 20 includes functional circuitry 23, power management circuitry 24, and memory array 25. The functionality provided by functional circuitry 23 may vary widely depending on the desired application. For example, if integrated circuit 20 is a large-scale device such as a "system on a chip", functional circuitry 23 may correspond to programmable logic circuitry such as a microprocessor or digital signal processor core, along with the corresponding support and interface circuitry of which memory array 25 and its peripheral circuitry would serve as an embedded memory resource; at another extreme, integrated circuit 20 may be a stand-alone memory device, in which case functional circuitry 23 would provide the support and interface circuitry for accessing memory array 25. As such, in embodiments of this invention, the construction and capability of functional circuitry 23 can correspond to any of a wide array of possibilities.

According to embodiments of this invention, memory array 25 is arranged as multiple memory array blocks $26_0$ through $26_3$. In this example, memory array blocks $26_0$ through $26_3$ are of different sizes relative to one another, but of course need not be. While four memory array blocks $26_0$ through $26_3$ are shown, memory array 25 may be realized by as few as one memory block 26, or by more than four memory array blocks $26_0$ through $26_3$, depending on the particular application. Each memory array block 26 is associated with corresponding decode and read/write circuitry 21, which is involved in the addressing of memory cells in its associated memory array block 26, including the reading and writing of stored contents.

Power management circuitry 24 regulates and distributes power supply voltages throughout integrated circuit 20. According to embodiments of this invention, power management circuitry 24 applies, to power supply line VDD, a power supply voltage sufficient to enable read and write operations to memory cells within memory array blocks 26. Power management circuitry 24 also produces and controls other power supply voltages, such as applied to decoder and read/write circuitry 21, functional circuitry 23, and power management circuitry 24 itself. Typically, power management circuitry 24 generates these and other power supply voltages from an external power supply voltage, which in this case is shown in FIG. 2 by external power supply terminal $V_{dd}$. Power management circuitry 24 may also include charge pump circuits or other functions that provide negative or other reference bias voltages, for example as applied to wells or substrate connections within integrated circuit 20, as conventional in the art. In some embodiments of this invention, power management circuitry 24 includes bandgap reference circuit 19 as shown in FIG. 2.

In connection with the operation of memory array 25, according to embodiments of this invention, memory array blocks $26_0$ through $26_3$ are associated with corresponding sets of bias devices $27_0$ through $27_3$, respectively. Bias devices $27_0$ through $27_3$ are each connected to ground reference voltage line $V_{ss}$, which in this case is a ground voltage level received from an external terminal as shown; alternatively, reference voltage line $V_{ss}$ may carry a reference voltage generated by power management circuitry 24, at a voltage other than external chip ground. As will be described in further detail below, bias devices $27_0$ through $27_3$ define corresponding reference voltages on sets of lines $VSSF_0$ through $VSSF_3$, respectively, relative to the ground reference voltage on line $V_{ss}$. Each set of reference voltage lines $VSSF_0$ through $VSSF_3$ includes one or more separate reference voltage lines connected to SRAM cells in its associated memory array block $26_0$ through $26_3$, respectively. A connection between ground reference line $V_{ss}$ and each set of ground reference lines $VSSF_0$ through $VSSF_3$ for each memory array block $26_0$ through $26_3$, respectively, is also made by way of respective sets of one or more switches $29_0$ through $29_3$. As shown by way of example in FIG. 2, switch $29_1$ is constructed as an n-channel MOS transistor with its source/drain path connected between its corresponding ground reference line $VSSF_1$ and ground line $V_{ss}$, and with its gate driven by control signal $RTA^*_1$ generated by power management circuitry 24. Alternatively, other control circuitry within integrated circuit 20 may generate the control signals $RTA^*_m$, in each of the embodiments of the invention described herein. As will become apparent from the following description, a single switch $29_m$ may be realized for a corresponding memory array block $26_m$, or multiple switches $29_m$ may be provided for memory array block $26_m$. Switches (or sets of switches, as the case may be) $29_0$, $29_2$, $29_3$ are similarly constructed and connected in the same manner as switch $29_k$. Of course, switches 29 may be constructed according to any other suitable device type or structure, depending on the desired manner in which its function described below is to be carried out. It is contemplated that these switches 29 will be realized by relatively large transistors, to provide ample drive when turned on, as will be discussed below.

According to embodiments of this invention, memory array blocks 26 are each constructed as conventional high-performance CMOS static random access memory (RAM) memory cells, arranged in rows and columns. As will be described in further detail below, these memory cells are constructed as 8-T CMOS SRAM cells, with separate word lines and bit lines for read and write data paths, as will be described in further detail below. Alternatively, the memory cells of memory array blocks 26 may be even more complex 10-T CMOS SRAM cells in which differential lines are used for both of the read and write data paths. In any event, it is contemplated that the memory cells realizing memory array blocks 26 will consume some level of DC current from a power supply voltage to a ground reference voltage in retaining stored data states.

According to modern CMOS technologies, the types of transistors used to realize memory array 25 can differ dramatically from those used elsewhere in integrated circuit 20. For example, the "array" type of transistors used to realize memory array 25 can be of minimum feature size (i.e., channel length), and fabricated in a different manner than the "core" transistors used to realize logic and power management functionality, to minimize the chip area required for memory array 25 while maintaining high performance devices in the core and periphery. In contrast, core transistors are fabricated to maximize switching performance, typically at a cost of increased chip area and process complexity. For example, to minimize gate leakage, memory array 25 transistors can receive an additional fluorine implant to increase the effective gate oxide thickness (e.g., by about 1 Å), while core region 23 transistors do not receive such an implant. Conversely, to improve performance, core region 23 transistors can be fabricated using conventional strain engineering techniques (e.g., selectively depositing a tensile silicon nitride film over core NMOS transistors and a compressive silicon nitride film over core PMOS transistors), while memory array 25 transistors do not receive such processing. The core and array transistors may also have significant differences in "pocket" implants that result in different threshold voltages relative to one another. As described in U.S. patent application Publication US 2009/0258471 A1, published Oct. 15, 2009 and entitled "Application of Different Isolation Schemes for Logic and Embedded Memory", commonly assigned with this application and incorporated herein by reference, the isolation structures and isolation doping profiles used in core region 23 can differ from those used in the memory arrays, so that tighter isolation spacing and thus higher device density can be attained in memory array 25. As evident from this description to those skilled in the art, these processing differences of transistors in core region 23 relative to transistors in memory array 25 involve structures that are relatively early in the manufacturing process (i.e., "base level" differences), rather than at the higher levels such as interconnections and metal conductor routing. As such, substantial chip area penalty would be involved if one were to construct a core transistor physically within memory array 25. According to embodiments of this invention, memory array blocks 26 are realized within areas of integrated circuit 20 realized by array transistors and not core transistors; conversely, the transistors of core region 23 are formed in areas away from memory array blocks 26. Memory periphery functions such as decoder and read/write circuitry 21 can be constructed as core devices, for example in areas of integrated circuit 20 near or adjacent to, but outside of, corresponding memory array blocks 26.

According to embodiments of this invention, each memory array block 26 in memory array 25 is capable of operating in a retain-till-accessed (RTA) mode, in which the voltage across each memory cell is reduced to a level above the data retention voltage (DRV), but in which its associated peripheral circuitry such as decoder and read/write circuitry 21 remains fully biased. As will be described below, in embodiments of this invention, each switch $29_m$ serves to short its reference voltage line $VSSF_m$ to ground reference voltage line $V_{ss}$ during such time as power management circuitry 24 determines that its memory array block $26_m$ is not in RTA mode (i.e., its control signal $RTA^*_m$ is active low). Conversely, if a memory array block $26_m$ is in RTA mode, its switch $29_m$ is open, permitting its bias devices $27_m$ to establish a voltage on line or lines $VSSF_m$ that is above the ground voltage at line $V_{ss}$, thus reducing the power consumed by memory array block $26_m$ by reducing the voltage drop across its cells.

As will be evident from the following description, the arrangement of integrated circuit 20 shown in FIG. 2 provides important advantages in optimizing the power reduction available in RTA mode for high-performance SRAM memories in which separate read and write data paths to the SRAM cells are provided. These advantages include the ability to reduce the bias across high-performance SRAM cells without impacting the read current from those SRAM cells, and with a reduced recovery time penalty, both effects of significant importance in high-performance SRAM implementations. In addition, embodiments of this invention enable additional power reduction by providing enhanced back-gate or body node bias to the pass transistors in these SRAM cells. Furthermore, embodiments of this invention enable closer matching of bias devices 27 to the corresponding memory array blocks 26, especially if the transistor sizes among the various memory array blocks 26 vary from block-to-block. This improved matching enables the RTA bias level to be set closer to the DRV for the specific construction of the memory cells in each block, without risking data loss. In addition, according to some embodiments of the invention, the matching and margin of the voltage drop in RTA mode is facilitated by construction of bias devices 27 as array devices, rather than as core devices; in some embodiments of the invention, this construction is attained with minimal chip area penalty. These and other advantages of this invention will become apparent from the following description.

Figure 1C:
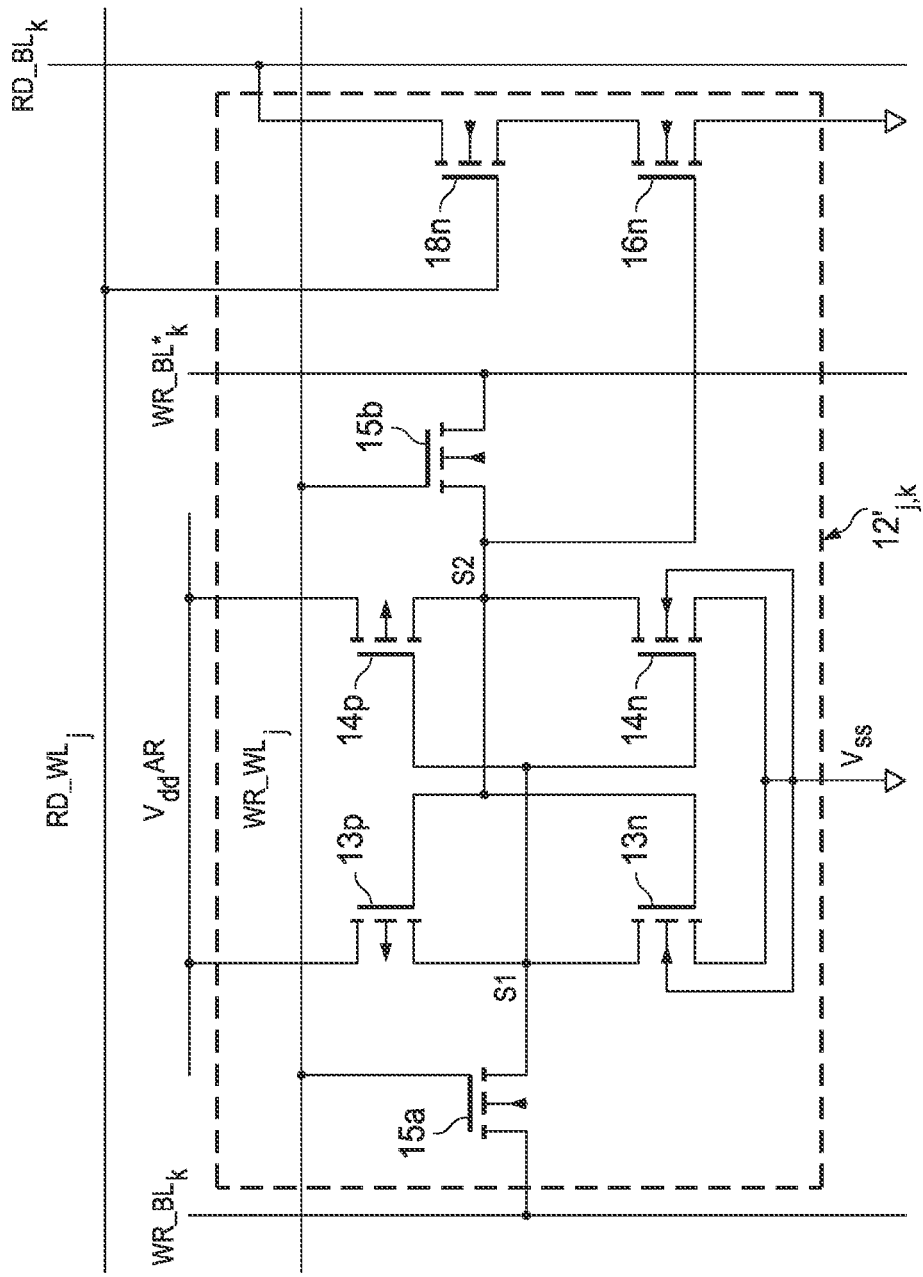
FIGS. 1c and 1d are electrical diagrams, in schematic form, of conventional high-performance memory cells.
Figure 1D:
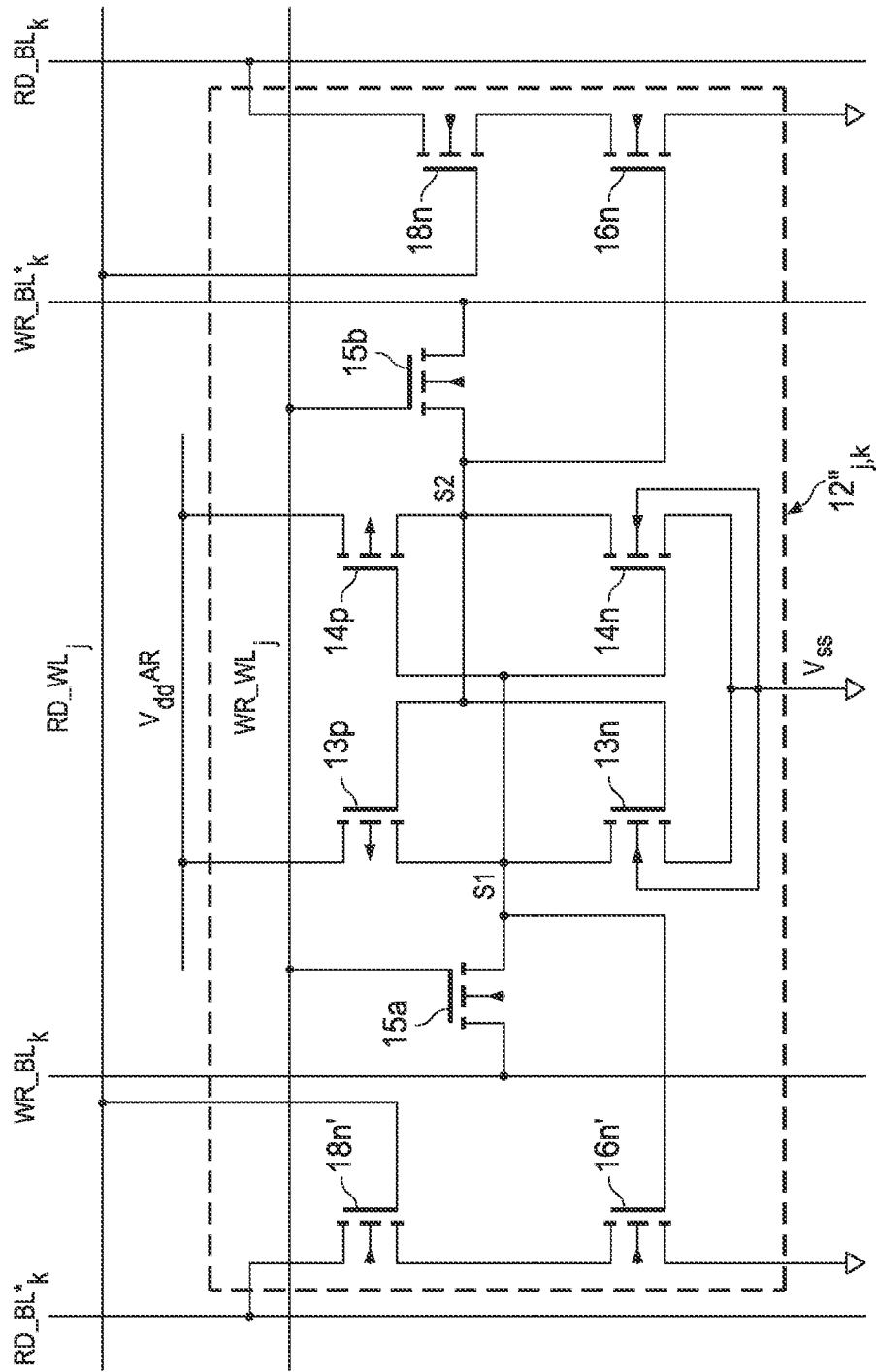
Figure 3:
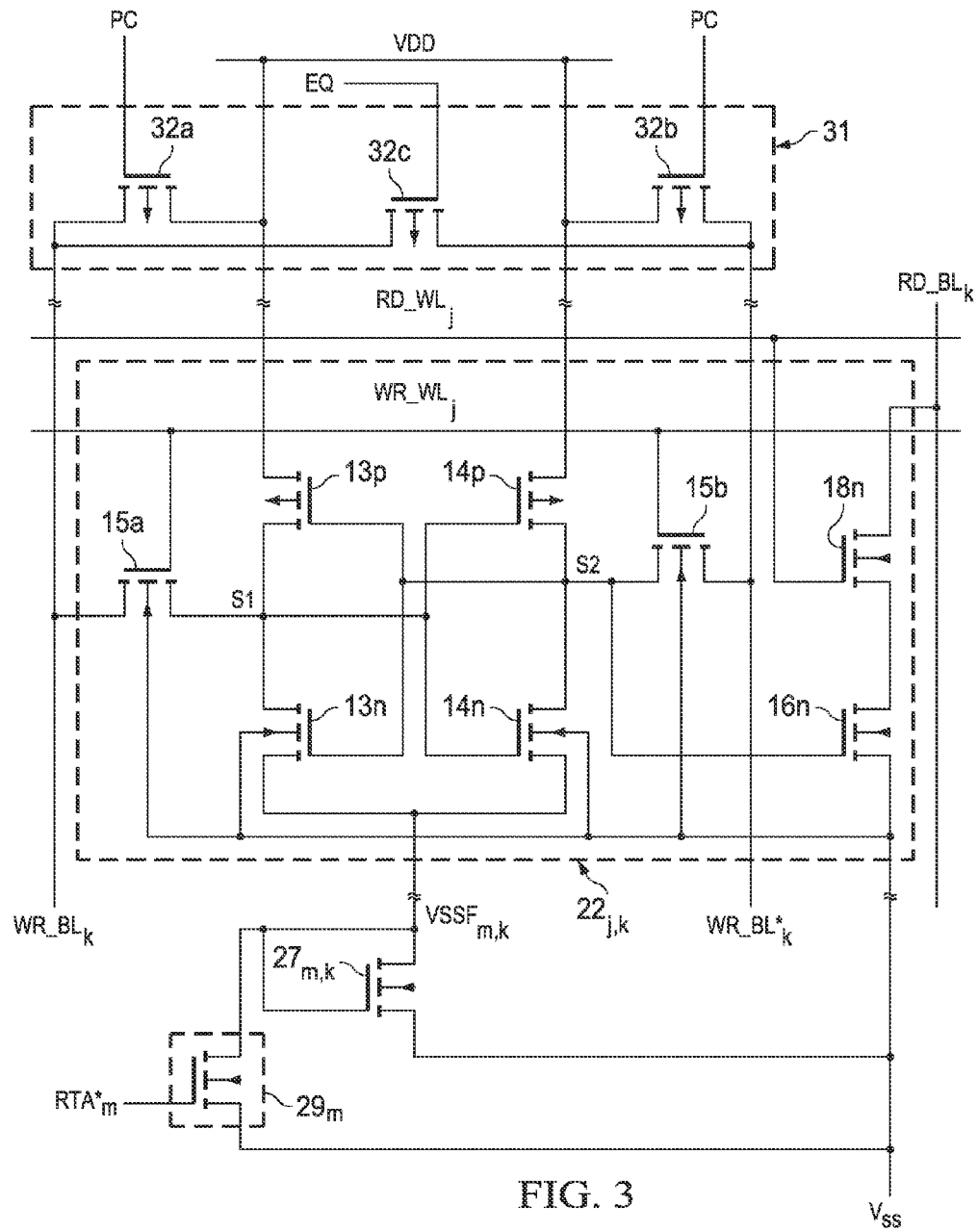
FIG. 3 is an electrical diagram, in schematic form, illustrating the connection of a bias device to a memory cell according to embodiments of this invention.

The construction and operation of an instance of bias device $27_{m,k}$ relative to one of SRAM cells $22_{j,k}$ in column k of its associated memory array block $26_m$ is shown in further detail in FIG. 3, for the example of an 8-T SRAM cell $22_{j,k}$. Cell $22_{j,k}$ is constructed in a similar manner as described above with reference to FIG. 1c, with the same reference numerals used to refer to like elements. Cell $22_{j,k}$ includes a 6-T latch of transistors 13p, 13n, 14p, 14n, 15a, 15b connected to form a pair of cross-coupled CMOS inverters (one inverter of series-connected p-channel transistor 13p and n-channel transistor 13n, and the other inverter of series-connected p-channel transistor 14p and re-channel transistor 14n) where the gates of the transistors in each inverter are connected together and to the storage node (S1, S2) of the other inverter, in the usual manner. N-channel pass transistors 15a, 15b have their source/drain paths connected between one of the cross-coupled nodes S1, S2 and a corresponding one of differential write bit lines WR_BL$_k$, WR_BL*$_k$, respectively; the gates of pass transistors 15a, 15b are driven by write word line WR_WL$_j$ for the row. Cell 22$_{j,k}$ also includes a 2-T read buffer formed of n-channel transistors 16n, 18n that have their source-drain paths connected in series between read bit line RD_BL$_k$ and ground reference voltage line V$_{ss}$. Read buffer pass transistor 18n has its drain connected to read bit line RD_BL$_k$ and its gate receiving read word line RD_WL$_j$ for row j. Read buffer driver transistor 16n has its drain connected to the source of transistor 18n and its source at ground reference voltage line V$_{ss}$; the gate of transistor 16n is connected to storage node S2; alternatively, the ground reference voltage to which the source of transistor 16n is connected may be a separately switched circuit ground, to eliminate leakage during standby or otherwise non-accessed times.

In cell 22$_{j,k}$, the cross-coupled inverters are connected between power supply line VDD and reference voltage line VSSF$_{m,k}$. As will be described in further detail below, reference voltage line VSSF$_{m,k}$ is dedicated to column k in memory array block 26$_m$ with its voltage defined by a corresponding instance of bias device 27$_{m,k}$. Alternatively, each reference voltage line VSSF$_m$ may support a group of columns in memory array block 26$_m$. Further in the alternative, each reference voltage line VSSF$_m$ may support all columns in memory array block 26$_m$, with its voltage defined by multiple bias devices 27$_m$ in parallel with one another. In any case, the source nodes of driver transistors 13n, 14n are connected to reference voltage line VSSF$_{m,k}$. In this embodiment of the invention, the body nodes (i.e., back gate bias nodes) of n-channel transistors 13n, 14n, 15a, 15b are connected to ground reference voltage line V$_{ss}$. In this manner, as will become apparent from the following description, the voltage drop across cell 22$_{j,k}$ (i.e., the voltage drop between power supply line VDD and reference voltage line VSSF$_{m,k}$) can be reduced in RTA mode, while advantageously maintaining a back-gate bias on pass transistors 15a, 15b and thus further reducing leakage.

As shown in FIG. 3, bias device 27$_{m,k}$ has its drain and gate connected to reference voltage line VSSF$_{m,k}$, and has its source connected to ground reference voltage line V$_{ss}$. As known in the art, the voltage drop across a forward biased diode depends on the diode threshold voltage, and also on the current drawn through the diode; in general, the voltage drop across a diode of a given current capacity (W/L ratio) will increase with increasing current. As such, the size (i.e., channel width and channel length) of each bias device 27$_m$ can be selected to define the desired voltage drop from reference voltage line VSSF$_{m,k}$ to ground reference line V$_{ss}$, for an expected level of leakage current for its associated SRAM cells 22. The feature sizes for bias device 27$_{m,k}$ is therefore not necessarily at the minimum feature sizes as may be used within SRAM cells 22; however, especially if bias device 27$_{m,k}$ is realized as an "array" transistor placed within the memory array region of memory array block 26$_m$, layout efficiency is optimized if the feature sizes of bias devices 27$_m$ match those of the transistors of SRAM cells 22, as proximity effects can be avoided.

Switch 29$_m$ has its source-drain path connected across the source-drain path of bias device 27$_{m,k}$, and its gate controlled by control signal RTA*$_m$. In this embodiment of the invention, switch 29$_m$ is constructed as a "core" device. Each bias device 27$_m$ may be associated with a corresponding instance of switch 29$_m$. Alternatively, a single instance of switch 29$_m$ may be used to short out, in parallel, all of bias devices 27$_m$ for memory array block 26$_m$. Particularly in high-performance SRAM memories, such as memory array block 26$_m$ including 8-T cells 22, it is preferred that reference voltage line VSSF$_{m,k}$ rapidly reach the voltage of ground reference voltage line V$_{ss}$ upon the exit of RTA mode with transistor 29$_m$ being turned on. As such, switch 29$_m$ is preferably a relatively large transistor (i.e., with high drive capability) and is preferably constructed for high speed switching and conduction, in the manner of core transistors described above. This large size and core transistor construction is best accomplished by placing switch 29$_m$ in core region 23 of integrated circuit 20, outside of memory array region 25, and distributed across multiple columns.

In normal operation (i.e., non-RTA mode) for reads and writes to memory array block 26$_m$, switch 29$_m$ is turned on by power management circuitry 24 asserting an active high logic level as control signal RTA*$_m$. To effect a write operation to cell 22$_{j,k}$, write word line WR_WL$_j$ at the gates of pass transistors 15a, 15b is asserted for selected row j, turning on pass transistors 15a, 15b and coupling storage nodes S1, S2 to complementary write bit lines WR_BL$_k$, WR_BL*$_k$ for column k. Read word line RD_WL$_j$ remains inactive low during this time, and transistors 16n, 18n do not affect the write to cell 22$_{j,k}$. Write circuitry (not shown) will pull one of complementary write bit lines WR_BL$_k$, WR_BL*$_k$ to ground reference voltage line V$_{ss}$ according to the data state being written into cell 22$_{j,k}$. This causes the corresponding storage node S1, S2 connected to that bit line WR_BL$_k$, WR_BL*$_k$ to also be pulled to ground. Upon release of write word line WR_WL$_j$, this state remains latched into cell 22$_{j,k}$. Conversely, in a read operation, read word line RD_WL$_j$ is asserted active high, and write word line WR_WL$_j$ remains inactive low. In this single-ended construction of cell 22$_{j,k}$ as shown in FIG. 3, transistor 16n is then turned on if storage node S2 is latched to a high logic level, in which case read bit line RD_BL$_k$ is pulled to ground reference voltage line V$_{ss}$. If storage node S2 is latched to a low logic level, transistor 16n will remain off, and read bit line RD_BL$_k$ will essentially remain at its precharged level. A sense amplifier (not shown) is capable of detecting whether read bit line RD_BL$_k$ is pulled to ground by the selected cell in column k, and in turn communicates that data state to I/O circuitry as appropriate.

In RTA mode, power management circuitry 24 turns switch 29$_m$ off, by way of an inactive low level on control signal line RTA$_m$. In this mode, the voltage at the source nodes of driver transistors 13n, 14n in each cell 22$_{j,k}$ in memory array block 26$_m$ will rise (due to leakage from power supply line VDD through cells 22$_{j,k}$) until it reaches a voltage that is a threshold voltage above that of ground reference voltage line V$_{ss}$, namely at about the forward-biased threshold voltage drop of the diode-connected n-channel MOS transistor used to realize bias device 27$_{k,m}$ in this example, as modulated by any current-dependent voltage modulation. Of course, while in this RTA mode, both read word line RD_WL$_j$ and write word line WR_WL$_k$ are maintained inactive low.

This embodiment of the invention provides important advantages as applied to high-performance 8-T (and, by extension, 10-T) SRAM cells such as cell 22$_{j,k}$. One such advantage is the ability to fully read cell 22$_{j,k}$ immediately upon exit from RTA mode, without a degradation of the read current. Consider, for example, the case in which cell $22_{j,k}$ of FIG. 4 is storing a "1" level at storage node S2 (i.e., and thus a "0" level at storage node S1). In this case, if read word line RD_WL$_j$ can be driven active high immediately upon exit from RTA mode, even if reference voltage line VSSF$_{m,k}$ has not yet fully discharged to ground reference voltage line V$_{ss}$, the "1" level at storage node S2 is reflected by a full read current level drawn from read bit line RD_BL through transistors 16$n$, 18$n$. This full current results from the source of transistor 16$n$ being directly connected to ground reference voltage line V$_{ss}$, and because load transistor 14$p$ at node S2 is biased to the full voltage at power supply line VDD (that voltage being applied to the gate of transistor 16$n$ in the read cycle). The current at read bit line RD_BL$_k$ is therefore not degraded even though cell $22_{j,k}$ has not fully recovered from RTA mode. In contrast, conventional RTA bias techniques applied by way of "header" devices such as described in FIG. 1$a$ would result in reduced read current during recovery from RTA mode, because of the reduced V$_{dd}$ level that would reduce the drive applied to the gate of transistor 16$n$.

Secondly, this embodiment of the invention serves to reduce the DC leakage drawn by cell $22_{j,k}$ in the RTA mode. As known in the art, bias of the body node (back gate) of an n-channel transistor to a negative voltage, below the voltage at its source, will have the effect of increasing the threshold voltage of the transistor. In the situation of SRAM cell $22_{j,k}$ of FIG. 3, the body nodes of driver transistors 13$n$, 14$n$ are biased to ground reference voltage line V$_{ss}$, which is below the voltage at reference voltage line VSSF$_{m,k}$ during RTA mode (i.e., one threshold voltage above V$_{ss}$). The effective threshold voltage of transistors 13$n$, 14$n$ is increased during RTA mode as a result, which reduces the sub-threshold leakage through the one of transistors 13$n$, 14$n$ that is nominally off based on the stored state in cell $22_{j,k}$ (e.g., transistor 14$n$ if storage node S2 is latched to a "1"). Accordingly, in addition to the reduction in DC leakage due to a reduced voltage drop across each cell $22_{j,k}$ in memory array block 26$_m$ in RTA mode, this embodiment of the invention further reduces the DC leakage by providing a negative back gate bias for pass transistors 15$a$, 15$b$ in cell $22_{j,k}$ in this manner. By way of simulation, it has been observed that the DC leakage reduction provided by this back gate bias can be on the order of 25%.

In addition, it has been observed that this embodiment of the invention allows faster access upon exit from RTA mode if an optimum bit line precharge voltage is used. As shown in FIG. 3, precharge circuitry 31 is provided to precharge the voltage of write bit lines WR_BL$_k$, WR_BL*$_k$ prior to each cycle; in this case, precharge circuitry 31 includes p-channel MOS transistors 32$a$, 32$b$ with source-drain paths connected between write bit lines WR_BL$_k$, WR_BL*$_k$, respectively, and power supply line VDD. Transistors 32$a$, 32$b$ each receive a control signal on line PC from control circuitry (not shown) in integrated circuit 20, such as within functional circuitry 23, power management circuitry 24, or the like. An equalization transistor 32$c$ can also be included, with a source-drain path connected between write bit lines WR_BL$_k$, WR_BL*$_k$, and gate receiving control signal EQ, to ensure that the voltages on write bit lines WR_BL$_k$, WR_BL*$_k$ are equalized prior to the cycle. At the appropriate time within each cycle, as known in the art, precharge circuitry 31 operates to charge the voltages on write bit lines WR_BL$_k$, WR_BL*$_k$ toward the voltage of power supply line VDD.

It has been observed, in connection with the embodiment of the invention shown in FIG. 3, that SRAM cells 22 can be accessed for write access earlier during the recovery time from RTA mode, before reference voltage line VSSF$_{m,k}$ is fully discharged to line V$_{ss}$ via switch 29$_m$, if the precharge voltage to write bit lines WR_BL$_k$, WR_BL*$_k$ is reduced to about 70% to 80% of its normal full level. In the example illustrated above in FIG. 3, this reduced precharge voltage can be attained by applying the appropriate voltage as control signal PC, or via the timing of control signal PC, or by using n-channel transistors connected in diode fashion in place of precharge transistors 32$a$, 32$b$. According to conventional architecture, the write bit line precharge voltage is nominally at that of power supply line VDD, for example at about 1.0 volts. According to this embodiment of the invention, it has been observed that a write bit line precharge voltage of about 0.7 volts, or from a range of about 0.6 volts to about 0.8 volts, allows earlier access to SRAM cells 22 upon RTA exit, without increasing the risk of disturbing the states of "half-selected" cells (i.e., those in a selected row but not a selected column). Good stability performance of these "half-selected" cells has been observed using this reduced write bit line precharge conditions even while reference voltage line VSSF$_{m,k}$ is still at 0.15 volts above the voltage of ground reference line V$_{ss}$. This has been observed to translate into an access time advantage of 150 psec, relative to the time at which full discharge of reference voltage line VSSF$_m$ occurs.

The cell stability provided by embodiments of this invention in this case of reduced write bit line precharge enables alternative methods of accessing cells 22 that can even further reduce power consumption. As discussed above, 8-T cell 22 (or a 10-T version with differential read buffers) produce a full read current level even if reference voltage line VSSF$_{m,k}$ has not yet fully discharged to ground reference voltage line V$_{ss}$, because read buffer driver transistor 16$n$ is biased directly to V$_{ss}$. As such, it has been observed, in connection with this invention, that switch 29$_m$ may remain off even during normal read operation, for both selected and unselected cells 22, with no significant degradation in performance or cell stability. In this case, the reduced power consumption of the RTA mode can be attained even during active read cycles. In this arrangement and with the reduced write bit line precharge voltage, switch 29$_m$ may be turned on only during write operations, and may remain off during read cycles. In this case, also as mentioned above, the actual write access of cells 22 may begin before full restoration of the V$_{ss}$ voltage at reference voltage line VSSF$_{m,k}$ through the action of switch 29$_m$. Further in the alternative, switch 29$_m$ may actually remain off also during write cycles, if somewhat reduced write performance is acceptable; in this case, power management circuitry 24 or other control circuitry may selectively turn on switch 29$_m$ in a margin screening test mode, in order to carry out device screening in manufacture. In the extreme, switch 29$_m$ may be eliminated altogether.

The architecture of bias devices 27$_m$ and switches 29$_m$ for a memory array block 26$_m$ according to an embodiment of the invention will now be described in connection with FIG. 4$a$. In the portion of memory array block 26$_m$ shown in FIG. 4$a$, SRAM cells 22 in two columns k, k+1, and three rows j, j+1, j+2 are illustrated by way of example, it being understood that memory array block 26$_m$ will likely include many more cells 22 in more columns and rows. For example, memory array blocks 26$_0$ through 26$_3$ may each have on the order of sixteen to sixty-four rows, and from as few as sixteen columns to as many as 512 columns or more. SRAM cells 22 in the arrangement of FIG. 4$a$ are constructed as described above in connection with FIG. 3. In this architecture, SRAM cells 22 in the same row share the same write word line and read word line (e.g., SRAM cells $22_{j,k}$ and $22_{j,k}$ each receive word lines WR_WL$_j$ and RD_WL$_j$), and SRAM cells in the same column are coupled to the same write bit line pair (e.g., SRAM cells $22_{j,k}$, $22_{j+1,k}$, $22_{j+2,k}$ are each connected to write bit lines $WR\_BL_k$, $WR\_BL^*_k$) and read bit line ($RD\_BL_k$).

In this embodiment of the invention, each column of SRAM cells 22 in memory array block $26_m$ is associated with an instance of a bias device $27_m$. More specifically, SRAM cells 22 that are associated with write bit lines $WR\_BL_k$, $WR\_BL^*_k$ and read bit line $RD\_BL_k$ (i.e., SRAM cells 22 in column k) are associated with bias device $27_{m,k}$; similarly, SRAM cells 22 in column k+1 are associated with bias device $27_{m,k+1}$. In other words, the number of bias devices $27_m$ associated with memory array block $26_m$ equals the number of columns of SRAM cells 22 in memory array block $26_m$.

Figure 4A:
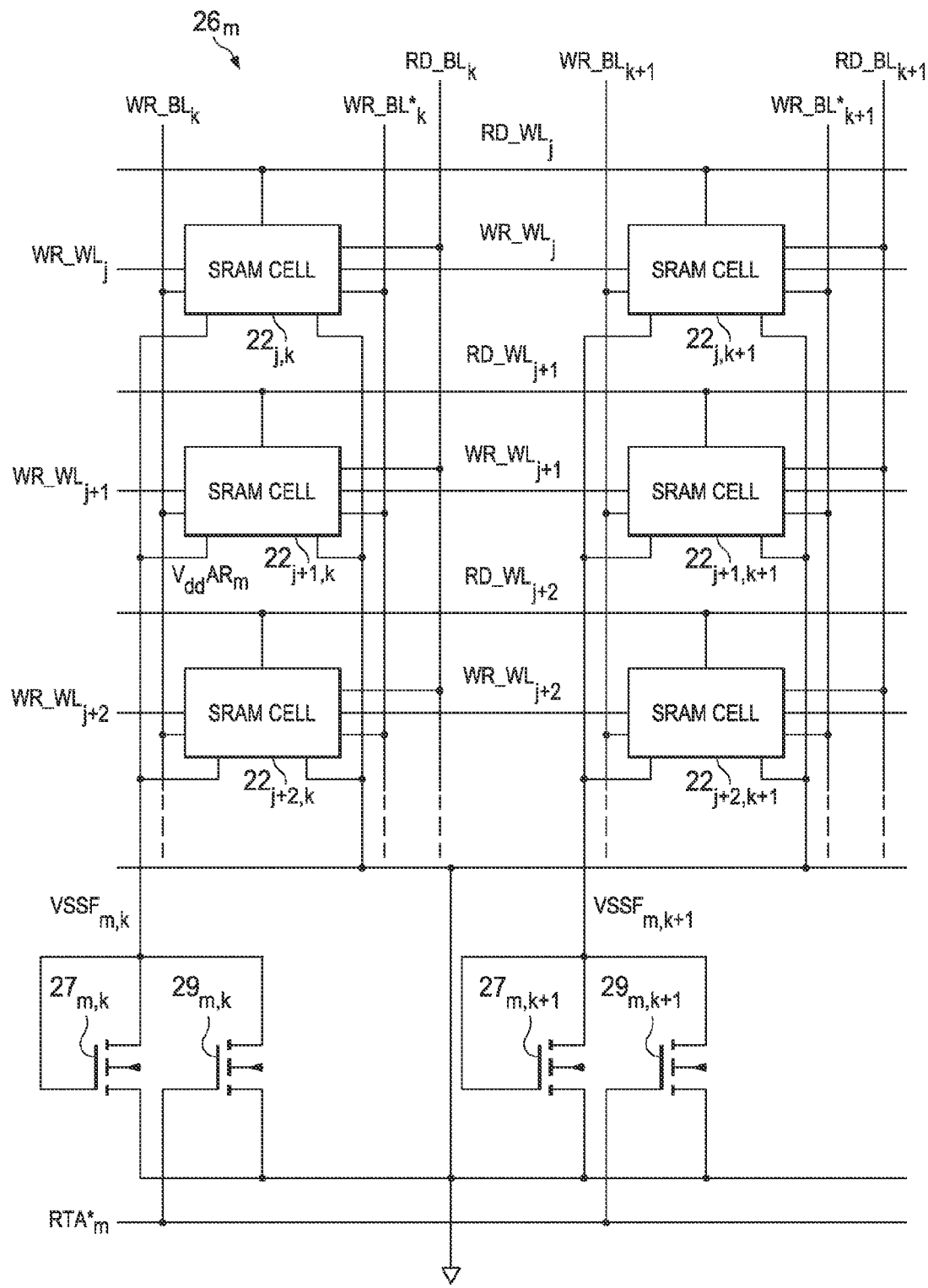
FIGS. 4a and 4b are electrical diagrams, in schematic form, of the implementation of bias devices in a memory array according to embodiments of this invention.

In addition, in this embodiment of the invention, each column of SRAM cells 22 in memory array block $26_m$ receives its own dedicated reference voltage line, as shown by way of reference voltage lines $VSSF_{m,k}$, $VSSF_{m,k}$ for columns k, k+1, respectively, in FIG. 4a. As described above in connection with FIG. 3, these reference voltage lines $VSSF_{m,k}$, $VSSF_{m,k+1}$ bias the source nodes of drive transistors 13n, 14n in the 6-T latch of each SRAM cell 22 in their respective columns k, k+1.

In this embodiment of the invention, referring to bias device $27_{m,k}$ by way of example, bias device $27_{m,k}$ is connected as an n-channel MOS diode with its anode at its associated reference voltage line $VSSF_{m,k}$ and its cathode at ground reference voltage line $V_{ss}$. Each bias device $27_m$ associated with memory array block $26_m$ is constructed and connected in a similar manner. This connection is, of course, obtained by the gate and drain of the n-channel transistor constituting bias device $27_{m,k}$ being connected to reference voltage line $VSSF_{m,k}$, and the source of this transistor connected to ground reference voltage line $V_{ss}$. Also in this embodiment of the invention, an instance of switch $29_m$ is associated with each column, as shown in FIG. 4a by the examples of switches $29_{m,k}$, $29_{m,k+1}$ associated with columns k, k+1, respectively. As described above in connection with FIG. 3, switches $29_{m,k}$, $29_{m,k+1}$ in this example are each constituted by an n-channel MOS transistor with its drain at the respective reference voltage line $VSSF_{m,k}$, $VSSF_{m,k+1}$, its source at ground reference voltage line $V_{ss}$ and its gate receiving control signal $RTA^*_m$.

This individual placement of individual switches $29_{m,k}$, $29_{m,k+1}$ per column assists rapid exit from RTA mode. Specifically, it is contemplated that the R-C delay involved in shorting reference voltage lines $VSSF_{m,k}$ to ground reference voltage line $V_{ss}$ is greatly reduced by providing these column-by-column switches $29_{m,k}$, $29_{m,k+1}$, as compared with using a single switch $29_m$ for the entire memory array block $26_0$. Of course, this improved RTA mode exit performance comes at the cost of chip area for realizing these multiple devices; it is contemplated that those skilled in the art having reference to this specification can evaluate this and other trade-offs for each particular design and architecture.

In this architecture, because multiple switches $29_{m,k}$, $29_{m,k+1}$ are provided for memory array block $26_m$, only those switches $29_{m,k}$ associated with half-addressed columns need be turned on in a write operation. In this alternative approach, the $RTA^*_m$ control signals applied to the gates of switches $29_{m,k}$ will also depend on the column address; as such, these individualized control signals may be generated by decoder circuitry 21 rather than directly by power management circuitry 24 (FIG. 2). This approach takes advantage of the improved write performance resulting from the reduced cell voltage as described above, by allowing column-selected cells 22 in the selected row that are to be written in the write cycle, but not the "half-selected" columns, to receive the raised bias at their reference voltage lines $VSSF_{m,k}$ resulting from their corresponding switch $29_{m,k}$ remaining off. Also in this case, provision may be made to selectively turn on switches $29_m$ for these selected columns in a special margin screening or test mode, in order to carry out device screening in manufacture. In addition, the reduced bit line precharge voltage described above may also be applied in this embodiment of the invention, to assist cell stability.

Figure 4B:
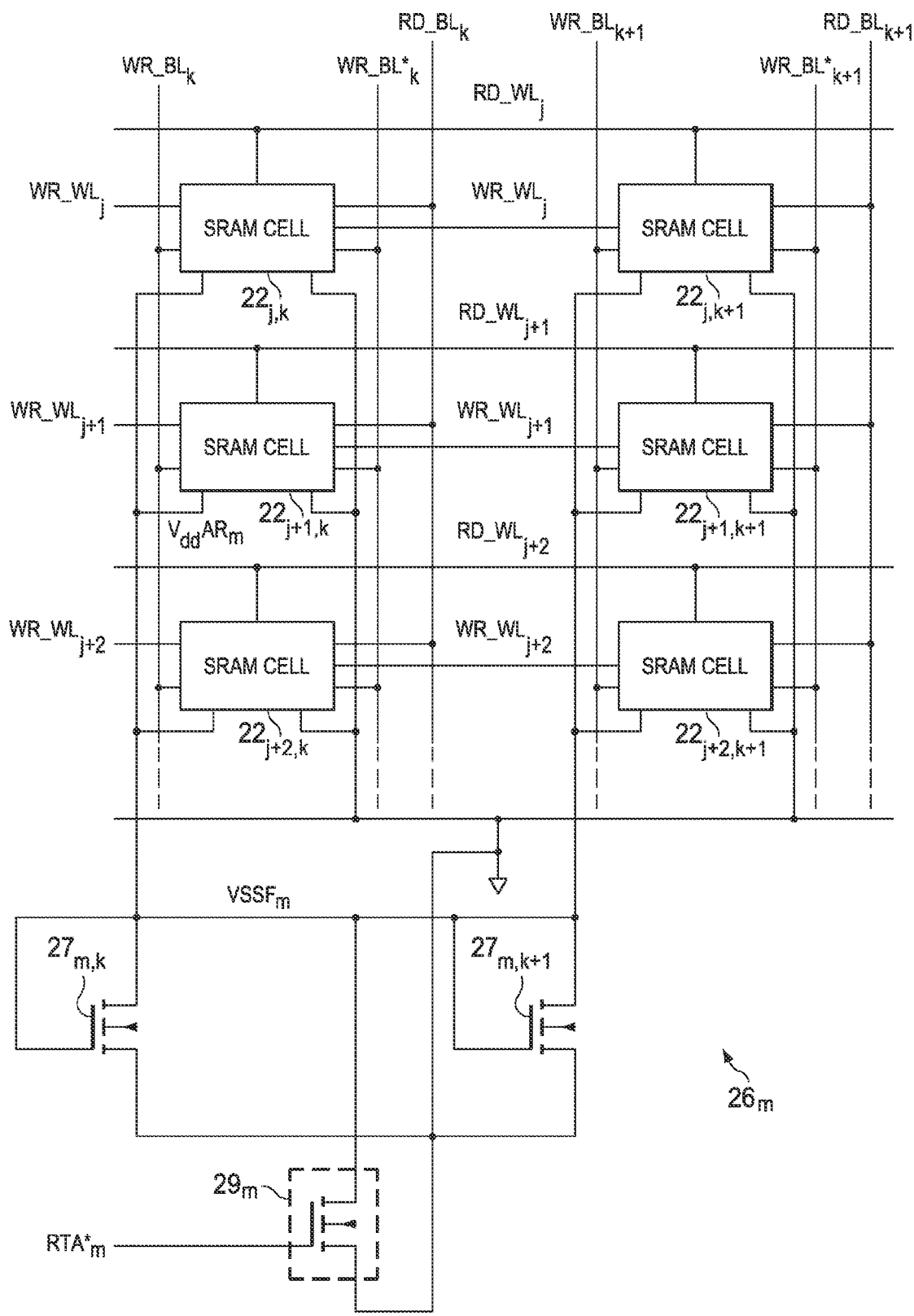

FIG. 4b illustrates an alternative realization of this embodiment of the invention, in connection with array portion $26'_m$. The construction of array portion $26'_m$ is essentially identical with that shown in FIG. 4a, with the exception that multiple bias devices $27_m$ are connected in parallel with one another between a shared reference voltage line $VSSF_m$ and ground reference voltage line $V_{ss}$. All bias devices $27_m$ associated with memory array block $26_m$ may be connected in parallel in this fashion, or bias devices $27_m$ may be grouped into a few groups, connected in parallel within each group. This parallel connection essentially establishes the RTA-mode voltage drop from reference voltage line $VSSF_m$ and ground reference voltage line $V_{ss}$ as an average of the diode drops across the parallel-connected bias devices $27_m$. As a result, a more robust reference voltage is defined at line $VSSF_m$, with reduced vulnerability to defects in a single one of bias devices $27_m$, and better tolerance to device mismatches caused by fabrication. This parallel connection also smoothes the effects of any mismatch and variations that are present.

The parallel connection of bias devices $27_m$ according to this architecture shown in FIG. 4b reduces the number of transistors required for switch $29_m$ for memory block array $26_m$. As shown in FIG. 4b, switch $29_m$ is realized by a single n-channel MOS transistor with its drain at reference voltage line $VSSF_m$, its source at ground reference voltage line $V_{ss}$ and its gate receiving control signal $RTA^*_m$. As such, switch $29_m$ is connected in parallel with bias devices $27_m$ and serves to short out all such bias devices $27_m$ that are connected in parallel. If, as mentioned above, multiple groups of parallel-connected bias devices $27_m$ are provided, it is contemplated that separate instances of switch $29_m$, at least one for each such group, will be provided. Of course, as mentioned above, a larger number of columns and bias devices 27 supported by each switch 29 can involve a larger R-C delay for the shorting action of switch 29.

In this example, each column of memory array block $26_m$ is associated with an instance of bias devices $27_m$. According to this parallel bias device architecture, however, more or fewer than one bias device $27_m$ per column may be implemented, depending on layout considerations and the desired characteristics for entry into and exit from RTA mode. In addition, also as mentioned above, the voltage drop across an instance of bias device $27_m$ will depend not only on its diode threshold voltage, but also on the current drawn through the diode; in general, the voltage drop across a diode of a given current capacity (W/L ratio) will increase with increasing current. In this embodiment of the invention, the current conducted by an instance of bias device $27_m$ depends on the number of columns it supports. Selection of the RTA mode voltage drop across bias devices $27_m$ can thus be made by selecting the number of parallel-connected bias devices $27_m$ implemented to source the expected leakage current of memory array block $26_m$. It is contemplated that those skilled in the art having reference to this specification will be readily able to determine the number and placement of bias devices 27 and corresponding switches 29 according to this parallel-connected embodiment of the invention, in a manner best suited for particular technologies and design constraints.

Figure 5A:
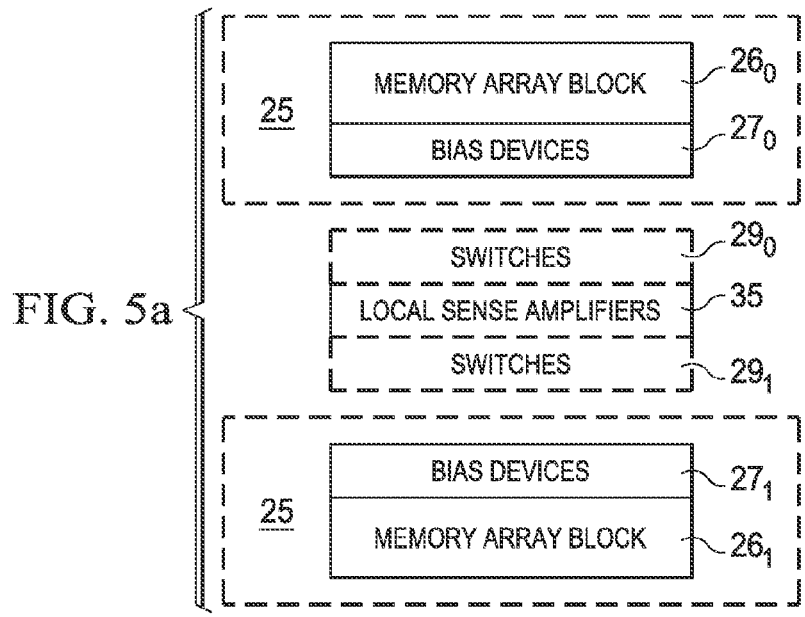
FIGS. 5a and 5b illustrate, in plan view, the layout of bias devices and memory array blocks according to embodiments of this invention.

It is further contemplated that one skilled in the art, having reference to this specification, will be readily able to realize and layout bias devices 27 and their corresponding switches 29, according to embodiments of this invention, in an efficient manner for a particular implementation, in a manner compatible with the construction of corresponding SRAM cells 22. A generalized layout of a portion of integrated circuit 20 at the surface of a semiconductor substrate or other semiconducting body (e.g., the active surface of a silicon-on-insulator layer), illustrating the relative placement of devices according to embodiments of the invention, is shown in FIG. 5a.

In this layout for embodiments of the invention, two memory array blocks $26_0$, $26_1$ are shown at the surface. Each of memory array blocks $26_0$, $26_1$ in this arrangement have a similar number of rows (running horizontally in FIG. 5a). In this example, a "break" is provided in the layout between memory array blocks $26_0$, $26_1$, within which circuitry such as local sense amplifiers 35, write circuits, column decoder circuitry, and the like is placed as shown in FIG. 5a. Switches $29_0$, $29_1$ (whether realized as one per memory array block 26, or one per column, or therebetween) are also placed within the break between memory array blocks $26_0$, $26_1$ along with local sense amplifiers 35.

In this embodiment of the invention, "core" transistors are used to realize functional circuitry 23, power management circuitry 24, and local sense amplifiers 35. Core transistors are also used, in this embodiment of the invention, to realize switches 29, to provide high levels of drive for switches 29 so that RTA mode can be rapidly exited, as described above. Conversely, in this example, bias devices 27 are each constructed as a diode-connected "array" transistor, fabricated by the same process steps and process parameters as used to fabricate n-channel transistors $13n$, $14n$ in each of SRAM cells 22. As a result, bias devices $27_m$ can be physically placed within the same region as associated memory array block $26_m$. This placement is illustrated in FIG. 5a by an instance of memory array region 25 within which memory array block $26_0$ and its bias devices $27_0$ are placed. Another instance of memory array region 25 contains memory array block $26_1$ and its bias devices $27_1$.

If bias devices 27 are realized as array transistors as in this embodiment of the invention, it has been observed that the chip area required is relatively modest. For example, the construction of bias devices 27 as array transistors within memory array region 25 can be accomplished by relatively simple and efficient means, accomplished by photomask patterns, and often only at "higher" levels (contact, metal). For example, it has been observed that realization of bias devices 27 occupies the chip area of about an additional half-row of SRAM cells 22 (i.e., about an additional 1.5% of the total chip area of a thirty-two row memory array block). It is contemplated that, in most cases, this chip area cost is tolerable in order to attain the resulting reduction in RTA-mode power consumption.

As known in the art, modern memory arrays constructed with extremely small (sub-micron) device sizes are best realized by regular and periodic bit cell structures, to avoid proximity effects in photolithographic patterning and asymmetric transistor strain. For example, as known in the art, many memory arrays are constructed to have "dummy" cell structures at their edges, such dummy cells effectively serving as a sacrificial row or column of structures that enable the interior bit cell structures to be free from such proximity effects. In order to most efficiently place bias devices 27 within the memory array region 25, as shown in FIG. 5a, the physical feature sizes (i.e., channel width and length) of the one or more transistors realizing each bias devices 27 are intended to be about the same as the feature sizes of SRAM cells 22. Some variation in feature sizes (i.e., channel width or channel length) may be tolerable, without requiring the insertion of "dummy" devices to absorb proximity effects. In any event, it is preferable to ensure that any such variations do not destroy the periodicity of layout within memory array region 25 so that "live" SRAM cell structures can be placed adjacent to bias devices 27 as will be discussed below.

Figure 5B:
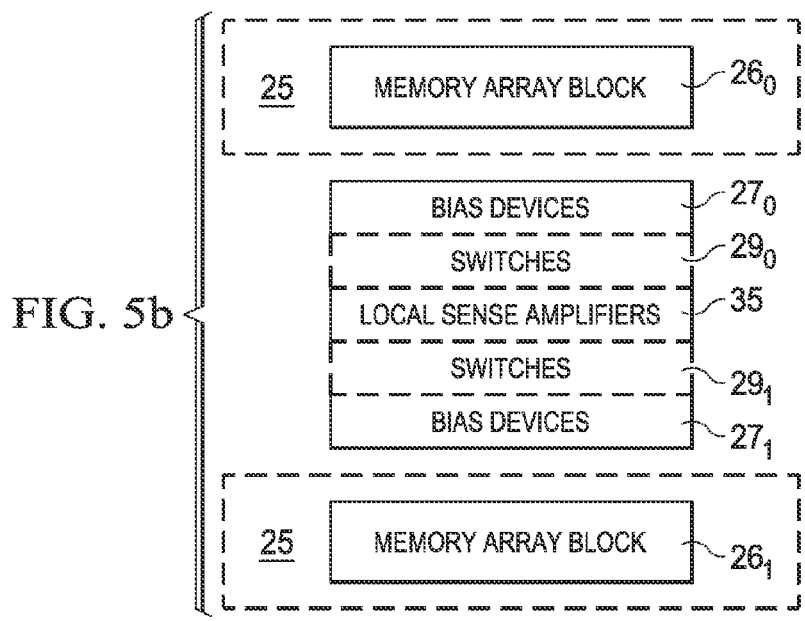

FIG. 5b illustrates an alternative placement of bias devices $27_0$, $27_1$ for memory array blocks $26_0$, $26_1$. In this example, bias devices $27_0$, $27_1$ are constructed as core transistors, in similar manner as local sense amplifiers 35, switches 29, functional circuitry 23 (FIG. 2), and the like, differing from the construction of transistors within SRAM cells 22. In this case, bias devices $27_0$ for memory array block $26_0$ are placed within the break between memory array blocks $26_0$, $26_1$, outside of memory array region 25 and along with local sense amplifiers 35 and corresponding one or more switches $29_0$ for memory array block $26_0$. Bias devices $27_1$ for memory array block $26_1$ are also formed as core devices, and reside outside of the memory array region 25 for memory array block $26_k$, in the break between memory array blocks $26_0$, $26_1$ along with local sense amplifiers 35 and switches $29_1$, among other circuitry as desired. In this case, the feature sizes and current capacity of bias devices 27 can be selected independently from the feature sizes of transistors in SRAM cells 22, enabling the designer to tune the voltage drop across bias devices 27 in the RTA mode.

Those skilled in the art having reference to this specification will readily comprehend alternative embodiments of this invention, and alternative implementations of the embodiments of the invention described in this specification. FIG. 6a illustrates SRAM cell $22_{j,k}$, constructed as described above in connection with FIG. 3, connected to bias device $37_{m,k}$ according to an alternative embodiment of the invention. Similarly as described above, bias device $37_{m,k}$ is a p-channel MOS transistor with its source connected to reference voltage line $VSSF_{m,k}$ for memory array block $26_m$ in which SRAM cell $22_{j,k}$ resides, and its drain at ground reference voltage line $V_{ss}$. Switch $29_{m,k}$ for column k of memory array block $26_m$ has its source-drain path connected in parallel with that of bias device $37_{m,k}$, and in parallel with that of all bias devices $37_m$ for memory array block $26_m$ as described above.

In this example, however, bias device $37_{m,k}$ is not diode-connected as in the embodiment of the invention described above in connection with FIG. 3. Rather, the gate of bias device $37_{m,k}$ is driven by reference bias voltage $V_{bg}$ generated by power management circuitry 24, for example by bandgap reference voltage circuit 19 within power management circuitry 24 as shown in FIG. 2, or elsewhere, as the case may be. In this embodiment of the invention, reference bias voltage $V_{bg}$ is selected to determine the drain-to-source voltage drop across bias device $37_{m,k}$ in RTA mode, such that the voltage drop across SRAM cells $22_{m,k}$ can be set at a voltage different from that defined simply by the device threshold voltage, as in the case of FIG. 3.

According to this embodiment of the invention, as before, bias device $37_m$ may be deployed one-per-column, in the manner described above relative to FIG. 4a, in fewer numbers than the number of columns in memory array block $26_m$; multiple bias devices $37_m$ may also be connected in parallel in the manner described above relative to FIG. 4b. In any event, all bias devices $37_m$ associated with memory array block $26_m$ would have their gates connected in common to receive reference bias voltage $V_{bg}$ as shown in FIG. 6a for bias device $37_{m,k}$.

The operation of this embodiment of the invention follows that described above in connection with FIG. 3. It is contemplated, in such operation, that the voltage on line $V_{bg}$ can remain constant in the RTA and normal operation mode, considering that switch $29_{m,k}$ controls whether the ground reference voltage on line $V_{ss}$ or the higher reference voltage defined by its bias device $37_{m,k}$ appears at reference voltage line $VSSF_{m,k}$.

In any event, bias devices $37_m$ provide similar advantages in defining an RTA mode bias for memory array block $26_m$ as described above in connection with FIGS. 3, 4a, and 4b. In summary, the voltage drop across cells 22 is reduced for the RTA mode while still permitting rapid read operations immediately upon exit from the RTA mode, with little or no impact on the read current seen at read bit lines $RD\_BL_k$. Selection of the appropriate write bit line precharge voltage, as described above, can further optimize cell access times during exit from RTA mode. In addition, back gate bias to the pass transistors 15a, 15b in SRAM cells 22 is provided, further reducing the DC leakage in RTA mode. Bias devices $37_m$ can be constructed either as array transistors or as core transistors, as described above relative to FIGS. 5a and 5b.

Various alternatives to these embodiments of the invention are also contemplated. For example, bias device $37_m$ may be alternatively realized in a diode-connected fashion with its source at reference voltage line $VSSF_{m,k}$ and its gate and drain connected to ground reference voltage line $V_{ss}$. In addition, the embodiments of this invention described above utilize single transistor bias devices. According to another embodiment of this invention, the bias devices for establishing the reference voltage applied to these high-performance SRAM cells, in RTA mode, each include more than one transistor. An example of this embodiment of the invention will now be described in detail, with reference to FIG. 6b.

Figure 1A:
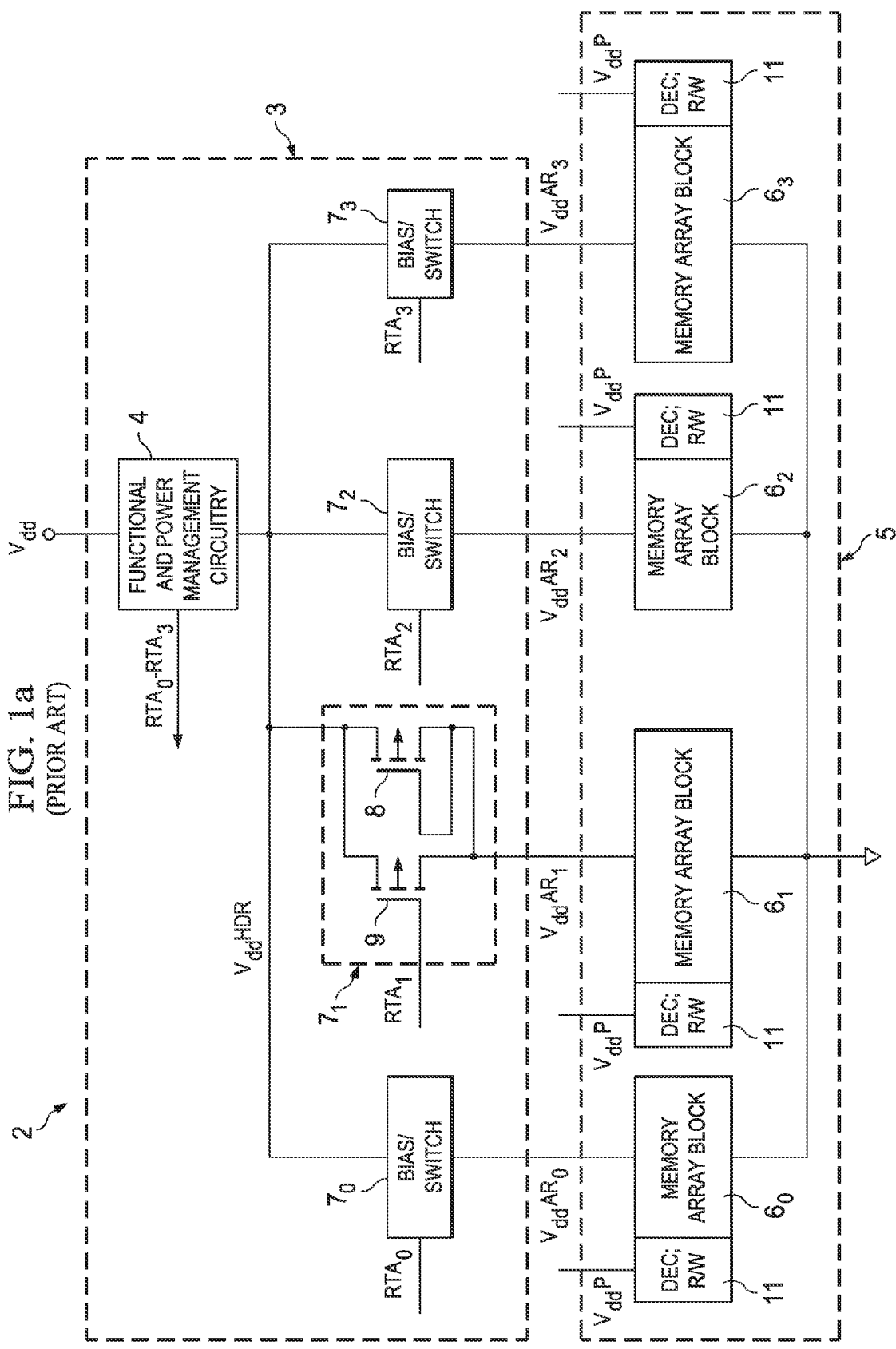
FIG. 1a is an electrical diagram, in block form, of a conventional integrated circuit including a memory array.
Figure 1B:
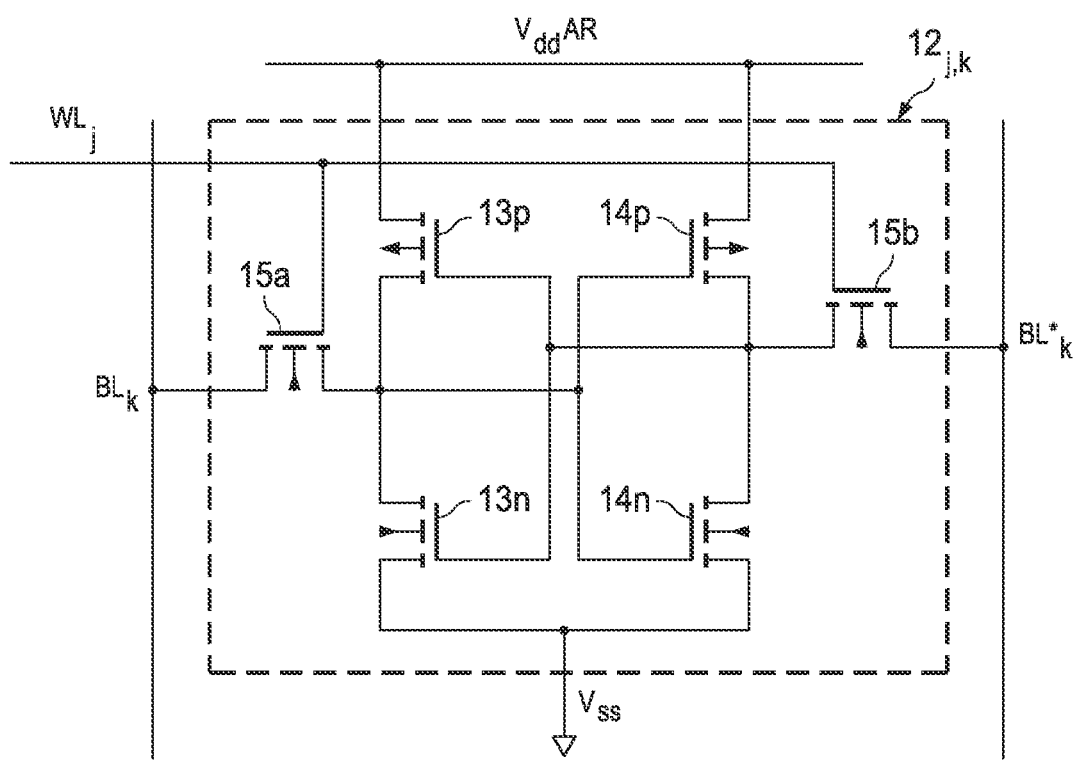
Figure 6B:
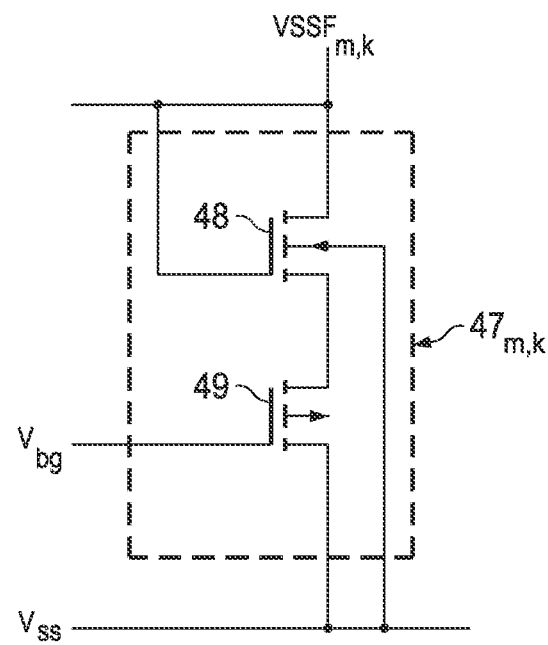
FIGS. 6a and 6b are electrical diagrams, in schematic form, of the implementation of bias devices according to other embodiments of this invention.
Figure 6A:
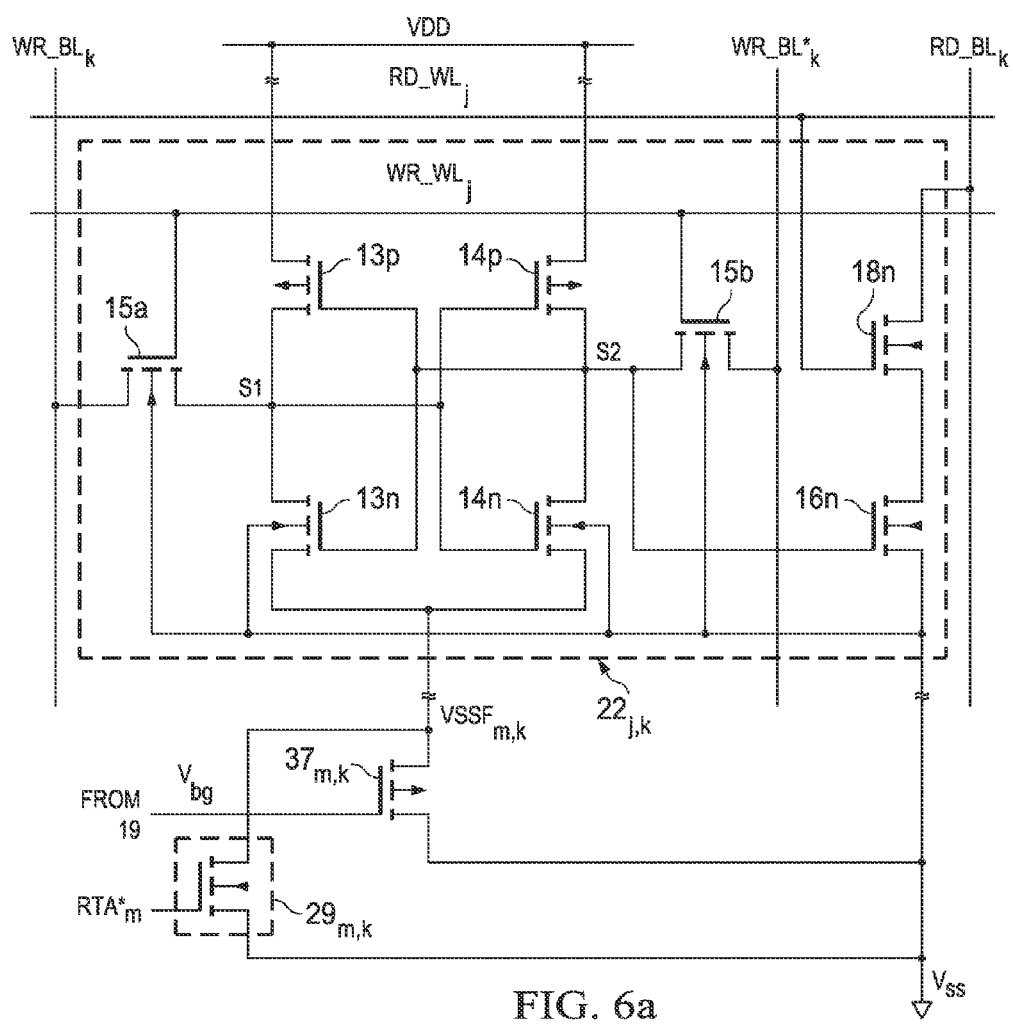

In the example of FIG. 6b, bias device $47_{m,k}$ is constructed as a pair of transistors 48, 49 with their source-drain paths connected in series between reference voltage line $VSSF_{m,k}$ and ground reference voltage line $V_{ss}$. In this example, n-channel transistor 48 is diode-connected, with its gate and drain at reference voltage line $VSSF_{m,k}$ and its body node (back gate) biased by ground reference voltage line $V_{ss}$. P-channel transistor 49 has its source connected to the source of transistor 48, its drain connected to ground reference voltage line $V_{ss}$, and its gate receiving reference bias voltage $V_{bg}$ as generated by bandgap voltage generator 19 or other circuitry within integrated circuit 20. As before, bias device $47_{m,k}$ has an associated switch $29_{m,k}$ connected in parallel with it between reference voltage line $VSSF_{m,k}$ and ground reference voltage line $V_{ss}$. Reference voltage line $VSSF_{m,k}$ biases the source nodes of n-channel driver transistors 13n, 14n in each SRAM cell 22 of column k, while ground reference voltage line biases the 2-T read buffer in each of those cells 22, as described above in connection with FIG. 3.

In the RTA mode (switch $29_{m,k}$ turned off), the voltage at reference voltage line $VSSF_{m,k}$ is defined by the sum of the voltage drops across transistors 48, 49 as leakage current conducts through SRAM cells 22. The voltage drop across transistor 48 amounts to about the threshold voltage of diode-connected transistor 48, considering the back gate bias of transistor 48 from ground reference voltage line $V_{ss}$, and the voltage drop across transistor 49 is controlled by the bias voltage $V_{bg}$ applied to its gate. It is contemplated that those skilled in the art can readily determine the voltage defined by bias device $47_{m,k}$ in the RTA mode, for a given implementation and bias voltage $V_{bg}$.

Typically, the use of multiple series-connected transistors to realize bias device $47_{m,k}$ will result in a higher voltage at reference voltage line $VSSF_{m,k}$, relative to ground reference voltage line $V_{ss}$, than if a single transistor is used in the previously-described embodiments of the invention. As a result, the use of multiple devices such as shown in FIG. 6b will generally be best used in those situations in which the voltage between power supply voltage line VDD and ground reference voltage line $V_{ss}$ is relatively large. For example, in some modern integrated circuits, a 1.8 volt $V_{dd}$ power supply is available, which is substantially higher than typical array power supply voltages of about 1.10 volts. This embodiment of the invention, in which bias device $47_{m,k}$ is realized by the series connection of two transistors 48, 49, is well-suited for such high power supply voltage applications, particularly if the data retention voltage remains relatively low (e.g., 0.65 volts).

As before, the number of bias devices $47_{m,k}$ provided for a given memory array block $26_m$ may vary from one-per-column to either more or fewer than one-per-column, depending on design and layout constraints. In addition, as described above, it is contemplated that the bias devices $47_m$ associated with a memory array block $26_m$ can either be connected to a single column, or connected in parallel for robust performance and stable definition of the RTA mode bias voltage. Still further in the alternative, while n-channel MOS transistor 48 and p-channel MOS transistor 49 are shown as realizing bias device $47_{m,k}$ in FIG. 6b for this embodiment of the invention, it is contemplated that either or both of these transistors may alternatively be realized as a p-channel transistor, with the gate connection and applied voltages modified to correspond to that channel conductivity type of device.

In any event, the embodiment of this invention shown in FIG. 6b provides the benefits of enabling fast recovery from RTA mode and minimal read current degradation for 8-T and 10-T SRAM cells 22 during that recovery time, and of decreased DC current draw because of the lower-voltage and back gate bias of pass transistors 15a, 15b In addition, if bias devices 47 are constructed as array devices, excellent device matching with the transistors of SRAM cells 22 can result, allowing the resulting RTA power supply bias to be placed closer to the data retention voltage.

It is contemplated that additional alternatives and variations to the embodiments of this invention described above will be apparent to those skilled in the art having reference to this specification, such alternatives and variations including the implementation of these approaches in solid-state memories of various types, constructed according to various technologies, and as may be embedded within larger-scale integrated circuits. Therefore, while the present invention has been described according to some of its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A semiconductor static random-access memory operable in a normal operating mode and a retain-till-accessed (RTA) mode, comprising:

a plurality of memory cells, arranged in rows and columns in at least one memory array block, each of the plurality of memory cells comprised of metal-oxide-semiconductor (MOS) array transistors arranged into a latch and a read buffer, wherein the latch of each of the memory cells in each column is biased in parallel between a power supply voltage node and a reference voltage node;

a first plurality of bias devices associated with a first memory array block, each of the first plurality of bias devices having a conduction path connected in series with memory cells in its associated memory array block between the reference voltage node and a ground reference voltage node; and a first switch device, having a conduction path connected between the reference voltage node and the ground reference voltage node, and having a control electrode receiving an RTA control signal so that the first switch device is turned on in the normal operating mode and turned off in the RTA mode;

wherein the latch in each of the plurality of memory cells comprises:

first and second cross-coupled inverters, biased between the power supply voltage and the reference node, the first and second cross-coupled inverters defining first and second storage nodes; and first and second pass transistors, the first pass transistor having a conduction path connected between the first storage node and a first write bit line, the second pass transistor having a conduction path connected between the second storage node and a second write bit line, and the first and second pass transistors having control electrodes coupled to a write word line;

and wherein the read buffer comprises:

a first read buffer driver transistor, having a conduction path, and having a control electrode coupled to the first storage node; and a first read buffer pass transistor, having a conduction path connected in series with the conduction path of the first read buffer driver transistor between a first read bit line and a ground reference voltage node, and having a control electrode coupled to a read word line.

2. The memory of claim 1, further comprising:
circuitry for generating the RTA control signal applied to the first switch device.

3. The memory of claim 1, wherein each of the first plurality of bias devices is associated with a single column of memory cells in the first memory array block.

4. The memory of claim 3, further comprising:
a plurality of first switch devices, each associated with one of the columns of the first memory array block, each having a conduction path connected between the reference voltage node for its associated column and the ground reference voltage node, and each having a control electrode receiving an RTA control signal so that it is turned on in the normal operating mode and turned off in the RTA mode.

5. The memory of claim 1, wherein the conduction paths of the first plurality of bias devices are connected in parallel with one another;
and wherein the first switch device has its conduction path connected in parallel with the conduction paths of the first plurality of bias devices.

6. The memory of claim 1, wherein each of the first plurality of bias devices comprises:
an MOS transistor having a source-drain path connected between the reference voltage node of its associated of its at least one column of memory cells and the ground reference voltage node, and having a gate connected to its drain.

7. The memory of claim 1, further comprising:
a voltage reference circuit, for generating a bias reference voltage;
and wherein each of the first plurality of bias devices comprises:

a first MOS transistor having a source-drain path connected between the reference voltage node of its associated of its at least one column of memory cells and the ground reference voltage node, and having a gate receiving the bias reference voltage from the voltage reference circuit.

8. The memory of claim 7, wherein each of the first plurality of bias devices further comprises:
a second MOS transistor having a source-drain path connected in series with the source-drain path of the first MOS transistor, and having a gate connected to its drain.

9. The memory of claim 1, wherein each of the first and second pass transistors comprises an n-channel MOS transistor having a source-drain path, a body node, and a gate;
and wherein the body nodes of the first and second pass transistors in each of the plurality of memory cells are connected to the ground reference voltage node.

10. The memory of claim 1, wherein the read buffer further comprises:
a second read buffer driver transistor, having a conduction path, and having a control electrode coupled to the second storage node; and
a second read buffer pass transistor, having a conduction path connected in series with the conduction path of the second read buffer driver transistor between a second read bit line and a ground reference voltage node, and having a control electrode coupled to the read word line.

11. The memory of claim 1, further comprising:
write bit line precharge circuitry, for precharging the first and second write bit lines of each column of the plurality of memory cells, prior to a memory access to the memory array block, to a voltage below than the voltage at the power supply voltage node.

12. The memory of claim 11, wherein the circuitry for generating the RTA control signal turns off the first switch device for read operations in the normal operating mode, and turns on the first switch device for write operations in the normal operating mode.

13. The memory of claim 11, further comprising:
a plurality of first switch devices, each associated with one or more of the columns of the first memory array block, each having a conduction path connected between the reference voltage node for its associated one or more columns and the ground reference voltage node, and each having a control electrode receiving an RTA control signal so that it is turned on for write operations to one or more of its associated columns in the normal operating mode, and turned off for read operations in the normal operating mode and in the RTA mode.

14. The method of claim 11, further comprising:
a plurality of first switches, each associated with one or more of the columns of the first memory array block, each having a conduction path connected between the reference voltage node for its associated one or more columns and the ground reference voltage node, and each having a control electrode receiving an RTA control signal so that it is turned off in the normal operating mode if a write operation is being performed for one of its associated columns, and in the RTA mode, and turned on in the normal operating mode if a write operation is not being performed to one of its associated columns.

15. The memory of claim 1, wherein each of the plurality of memory cells for a first memory array block is comprised of MOS array transistors disposed in a memory array region of an integrated circuit;

wherein each of the first plurality of bias devices comprises a MOS array transistor disposed in the memory array region;

and wherein the first switch device comprises a MOS core transistor having different construction from the MOS array transistors, and disposed outside of the memory array region.

16. The memory of claim 1, wherein each of the plurality of memory cells for a first memory array block comprises MOS array transistors disposed in a memory array region of an integrated circuit;

wherein each of the first plurality of bias devices comprises a MOS core transistor having different construction from the MOS array transistors, and disposed outside of the memory array region;

and wherein the first switch device comprises a MOS core transistor disposed outside of the memory array region.

17. The memory of claim 1, wherein the plurality of memory cells are arranged in rows and columns in a plurality of memory array blocks; and further comprising:

a second plurality of bias devices associated with a second memory array block, each of the second plurality of bias devices having a conduction path connected in series with memory cells in its associated memory array block between a second reference voltage node and a ground reference voltage node; and a second switch device, having a conduction path connected between the second reference voltage node and the ground reference voltage node, and having a control electrode receiving an RTA control signal so that the second switch device is turned on in the normal operating mode for the second memory array block, and turned off in the RTA mode for the second memory array block.

18. A method of operating a memory in a normal operating mode and a retain-till-accessed (RTA) mode; wherein the memory comprises;

a plurality of memory cells, arranged in rows and columns in at least one memory array block, each of the plurality of memory cells comprised of metal-oxide-semiconductor (MOS) array transistors arranged into a latch and a read buffer, wherein the latch of each of the memory cells in each column biased in parallel between a power supply voltage node and a reference voltage node; and a first plurality of bias devices associated with a first memory array block, each of the first plurality of bias devices having a conduction path connected in series with memory cells in its associated memory array block between the reference voltage node and a ground reference voltage node;

wherein the latch in each of the plurality of memory cells comprises:

first and second cross-coupled inverters, biased between the power supply voltage and the reference node, the first and second cross-coupled inverters defining first and second storage nodes; and first and second pass transistors, the first pass transistor having a conduction path connected between the first storage node and a first write bit line, the second pass transistor having a conduction path connected between the second storage node and a second write bit line, and the first and second pass transistors having control electrodes coupled to a write word line;

and wherein the read buffer comprises:

a first read buffer driver transistor, having a conduction path, and having a control electrode coupled to the first storage node; and a first read buffer pass transistor, having a conduction path connected in series with the conduction path of the first read buffer driver transistor between a first read bit line and a ground reference voltage node, and having a control electrode coupled to a read word line;

the method comprising the steps of:

in the normal operating mode for a first memory array block, closing a first switch between the ground reference voltage node and the reference voltage node for one or more of the columns of the first memory array block; and in the RTA mode for the first memory array block, opening the first switch.

19. The method of claim 18, wherein the memory further comprises:

a second plurality of bias devices associated with a second memory array block, each of the second plurality of bias devices having a conduction path connected in series with the memory cells in its associated memory array block between a second reference voltage node and a ground reference voltage node; and wherein the method further comprises:

in the normal operating mode for the second memory array block, closing a second switch between the ground reference voltage node and the second reference voltage node for one or more of the columns of the second memory array block; and in the RTA mode for the second memory array block, opening the second switch;

wherein the step of opening the second switch is performed during the step of closing the first switch, so that the second memory array block is in RTA mode while the first memory array block is in the normal operating mode.

20. The method of claim 18, wherein each of the first plurality of bias devices comprises:

an MOS transistor connected as a diode.

21. The method of claim 18, wherein each of the first plurality of bias devices comprises:

a first MOS transistor having a source-drain path connected between the reference voltage node and the ground reference voltage node of each of its at least one column of memory cells, and having a gate; and wherein the method further comprises:

generating a bias reference voltage; and applying the bias reference voltage to the gate of each of the first MOS transistors.

22. The method of claim 21, wherein each of the first plurality of bias devices further comprises:

a second MOS transistor having a source-drain path connected in series with the source-drain path of the first MOS transistor, and having a gate connected to its drain.

23. The method of claim 18, wherein each of the first plurality of bias devices is associated with a single column of memory cells in the first memory array block;

and wherein the memory comprises a plurality of first switch devices, each associated with one of the columns of the first memory array block, each having a conduction path connected between the reference voltage node for its associated column and the ground reference voltage node;

wherein the step of closing the first switch comprises closing each of the plurality of first switch devices;

and wherein the step of opening the first switch comprises opening each of the plurality of first switch devices.

24. The method of claim 18, further comprising:
prechargingthe first and second write bit lines of each column of the plurality of memory cells, prior to a memory access to the first memory array block, to a voltage below than the voltage at the power supply voltage node.

25. The method of claim 24, wherein the method further comprises:
after the precharging step, closing the first switch;
after the precharging step, applying an input data state to the first and second write bit lines;
after the step of closing the first switch, turning on the first and second pass transistors.

26. The method of claim 25, wherein the step of turning on the first and second pass transistors begins before the voltage at the reference voltage node reaches the voltage at the ground reference voltage node.

27. The method of claim 24, wherein the step of closing the first switch is performed in the normal operating mode for write operations; and further comprising:
turning off the first switch in the normal operating mode for read operations.

28. The method of claim 24, wherein each of a plurality of first switches are associated with one or more of the columns of the first memory array block, each having a conduction path connected between the reference voltage node for its associated one or more columns and the ground reference voltage node; further comprising:
in the normal operating mode for a first memory array block, opening each of the plurality of first switches associated with a column of the first memory array block to which a write operation is being performed; and
wherein the step of closing the first switch comprises:
closing each of the plurality of first switches not associated with a column of the first memory array block to which a write operation is being performed.

29. A semiconductor static random-access memory, comprising:
a plurality of memory cells, arranged in rows and columns in at least one memory array block, each of the plurality of memory cells comprised of metal-oxide-semiconductor (MOS) array transistors arranged into a latch and a read buffer, wherein the latch of each of the memory cells in each column is biased in parallel between a power supply voltage node and a reference voltage node;
a first plurality of bias devices associated with a first memory array block, each of the first plurality of bias devices having a conduction path connected in series with memory cells in its associated memory array block between the reference voltage node and a ground reference voltage node; and
a first switch device, having a conduction path connected between the reference voltage node and the ground reference voltage node, and having a control electrode for receiving a control signal;
wherein the latch in each of the plurality of memory cells comprises:
first and second cross-coupled inverters, biased between the power supply voltage and the reference node, the first and second cross-coupled inverters defining first and second storage nodes; and
first and second pass transistors, the first pass transistor having a conduction path connected between the first storage node and a first write bit line, the second pass transistor having a conduction path connected between the second storage node and a second write bit line, and the first and second pass transistors having control electrodes coupled to a write word line;
and wherein the read buffer comprises:
a first read buffer driver transistor, having a conduction path, and having a control electrode coupled to the first storage node; and
a first read buffer pass transistor, having a conduction path connected in series with the conduction path of the first read buffer driver transistor between a first read bit line and a ground reference voltage node, and having a control electrode coupled to a read word line.

30. The memory of claim 29, further comprising:
circuitry for generating the control signal applied to the first switch device so that the first switch device is turned off in the normal operating mode and in the RTA mode, and turned on in a margin screening mode.

31. The memory of claim 30, further comprising:
a plurality of first switch devices, each associated with one of the columns of the first memory array block, each having a conduction path connected between the reference voltage node for its associated column and the ground reference voltage node, and each having a control electrode receiving a control signal from the generating circuitry.

* * * * *